United States Patent [19]

Kitakado et al.

[11] Patent Number: 5,398,291
[45] Date of Patent: *Mar. 14, 1995

[54] METHOD AND APPARATUS FOR DETECTING NECK DISCONNECTION BETWEEN LAND AND LINE OF WIRING PATTERN ON PRINTED BOARD

[75] Inventors: Ryuji Kitakado; Hiroyuki Onishi, both of Tenjinkitamachi, Japan

[73] Assignee: Dainippon Screen Mfg. Co., Ltd., Kyoto, Japan

[*] Notice: The portion of the term of this patent subsequent to Jun. 25, 2008 has been disclaimed.

[21] Appl. No.: 792,354

[22] Filed: Nov. 14, 1991

[30] Foreign Application Priority Data

Nov. 19, 1990 [JP] Japan ................. 3-315503
May 31, 1991 [JP] Japan ................. 3-157806

[51] Int. Cl.$^6$ ............................... G06K 9/00
[52] U.S. Cl. ............................ 382/8; 382/28; 382/26; 348/126
[58] Field of Search ............ 382/8, 25, 26, 27, 55; 358/101, 106; 356/237; H04N 7/00, 7/18; 348/126, 129, 130, 131

[56] References Cited

U.S. PATENT DOCUMENTS

| | | | |
|---|---|---|---|
| 4,555,798 | 11/1985 | Broadbent, Jr. et al. | 382/8 |
| 5,027,417 | 6/1991 | Kitakado et al. | 382/8 |
| 5,119,434 | 6/1992 | Bishop et al. | 382/8 |
| 5,144,681 | 9/1992 | Kitakado et al. | 382/8 |
| 5,150,422 | 9/1992 | Kitakado et al. | 382/8 |
| 5,214,712 | 5/1993 | Yamamoto et al. | 382/8 |

*Primary Examiner*—Leo H. Boudreau
*Assistant Examiner*—Andrew W. Johns
*Attorney, Agent, or Firm*—Ostrolenk, Faber, Gerb & Soffen

[57] ABSTRACT

A method and apparatus for detecting neck disconnection between a land and a line in a wiring pattern on a printed board includes a scanner for obtaining images of the wiring pattern and a through hole formed in the pattern. The image of the wiring pattern is converted to a line image representing a wiring line by thinning the pattern image. A window encompassing the image of the through hole is defined, and part of the thinned pattern image overlapping the window is extracted. The number of end points of the thinned pattern image is counted in the window. If the number of the end points is an odd number larger than one, it is determined that neck disconnection is present in the wiring pattern.

24 Claims, 45 Drawing Sheets

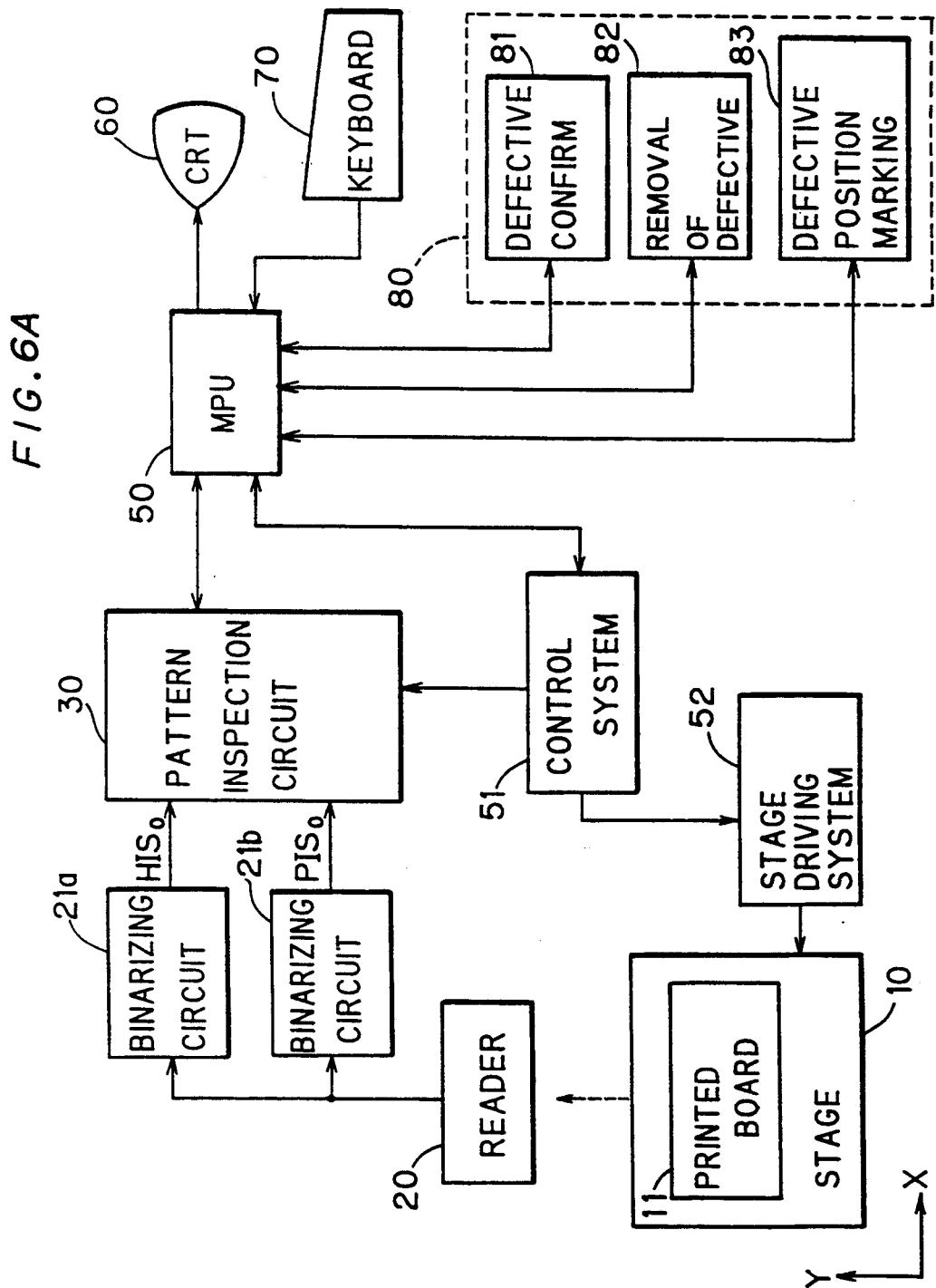

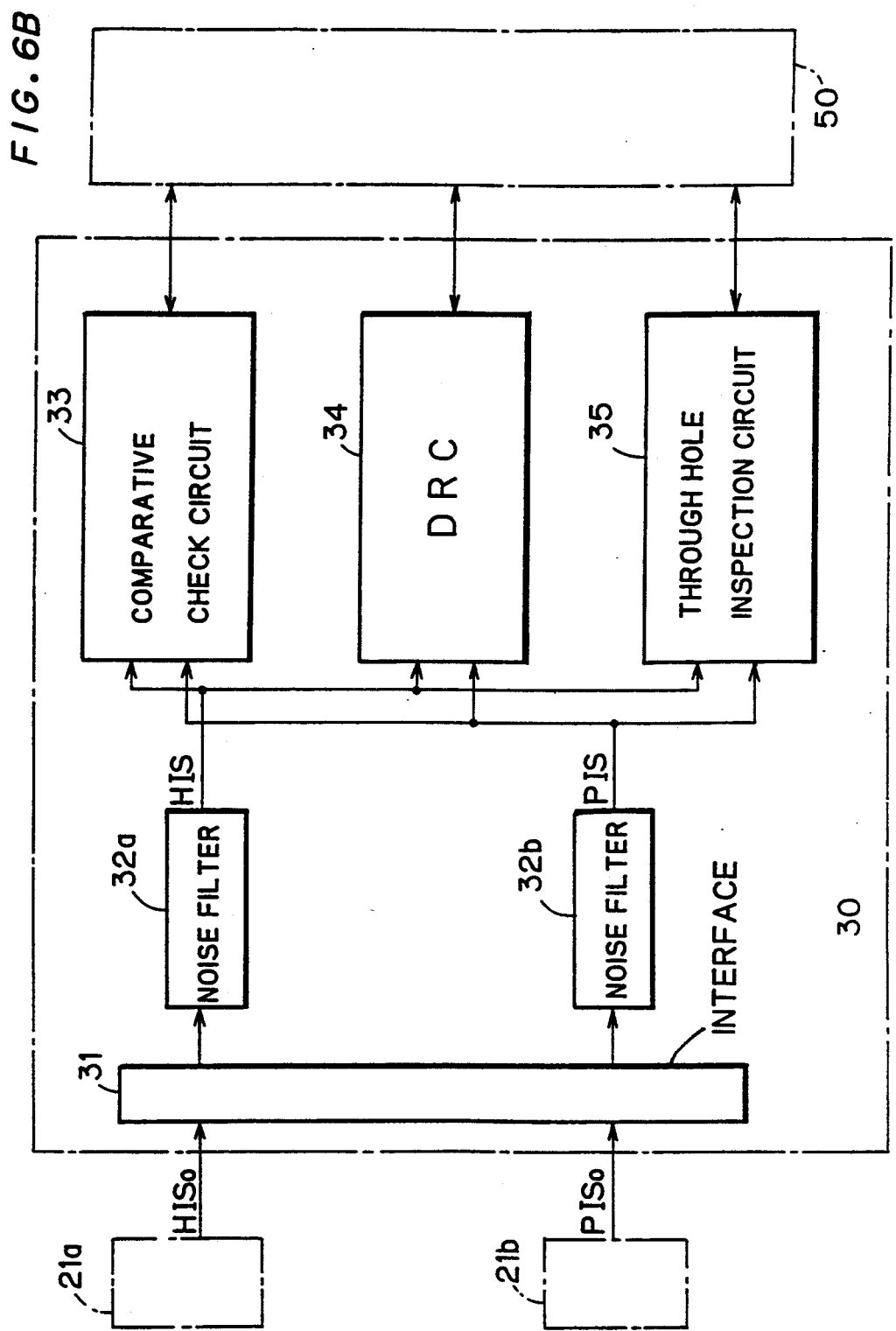

FIG.11(a)

|   |   |   |
|---|---|---|
| 0 OR 1 | 1 | 0 OR 1 ← OBJECT PIXEL |
| 0 | 0 | 0 |
| 1 | 1 | 1 |

THINNING ↑

FIG.11(b)

|   |   |   |
|---|---|---|
| 0 OR 1 | 0 | 0 OR 1 ← OBJECT PIXEL |
| 0 | 0 | 0 |
| 1 | 1 | 1 |

FIG. 12
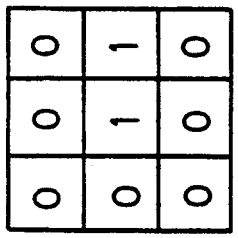
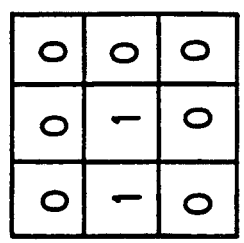
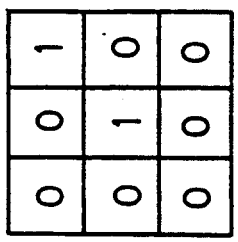
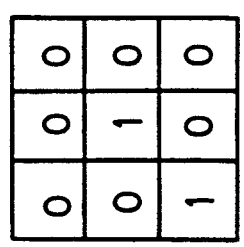
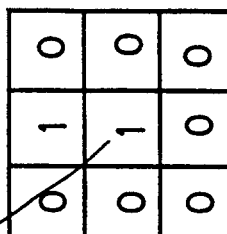
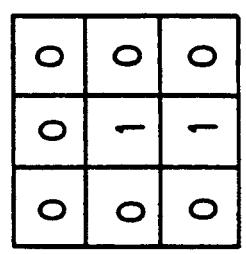
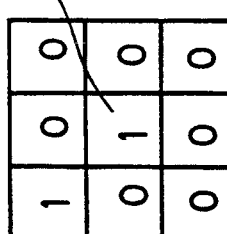

Lx : MINIMUM INTEGER EXCLUDING ZERO IN L1 TO L9

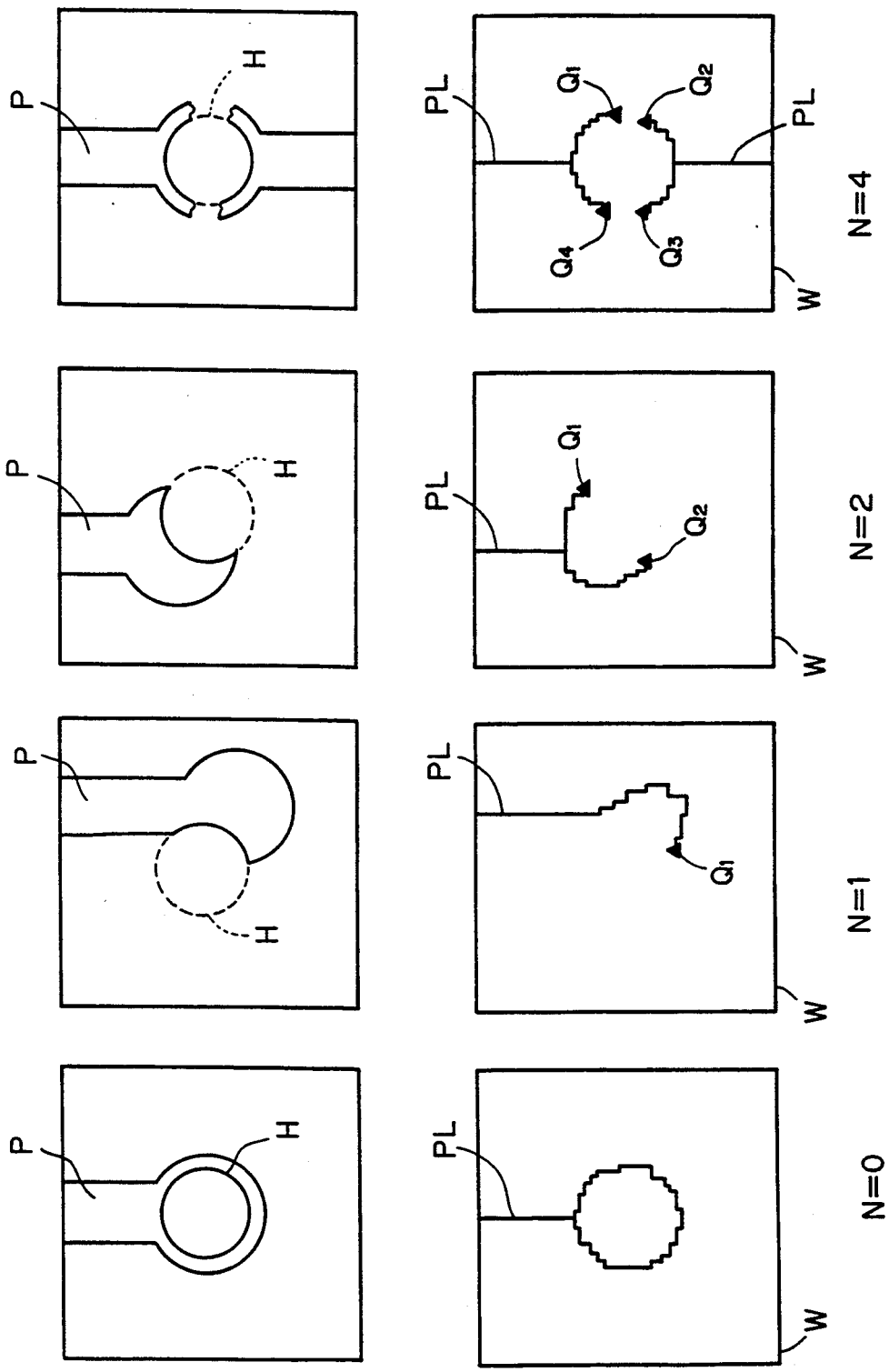

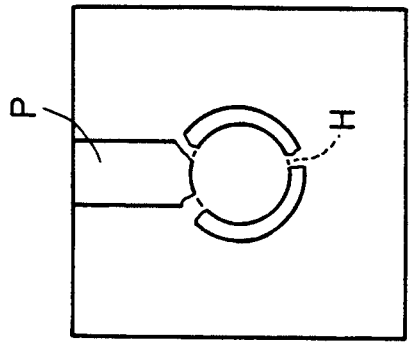
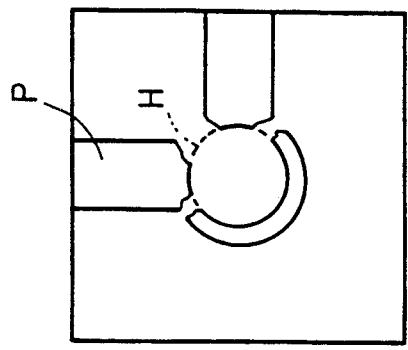
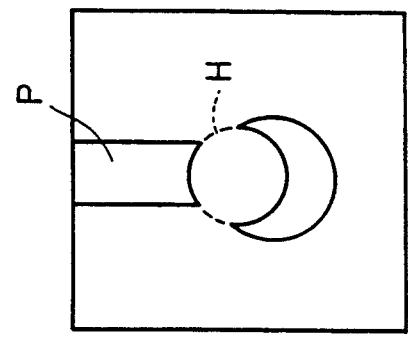
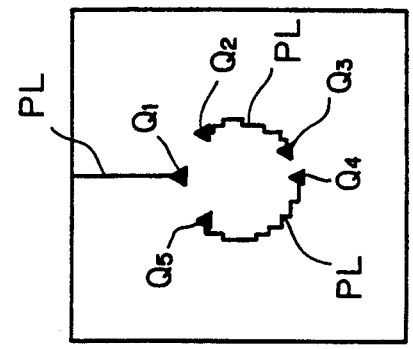
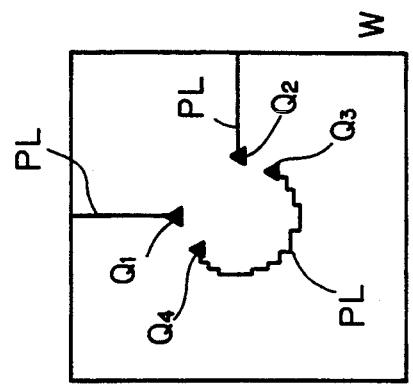
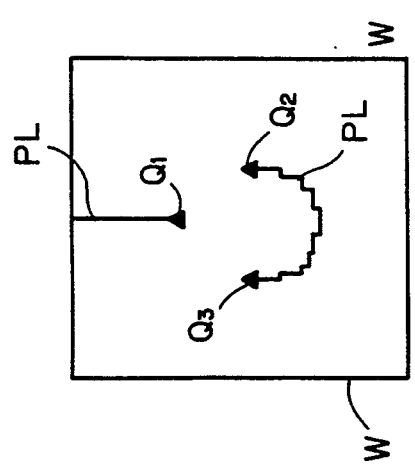
FIG. 20B

METHOD AND APPARATUS FOR DETECTING NECK DISCONNECTION BETWEEN LAND AND LINE OF WIRING PATTERN ON PRINTED BOARD

BACKGROUND OF THE INVENTION

1. Field of the Invention

The present invention relates to a method of and apparatus for inspecting a printed board, and more particularly, it relates to an improvement in detecting neck disconnection between a land and a line of a wiring pattern.

2. Description of the Prior Art

With reduction in size and weight as well as improvement in performance of electronic components, a wiring pattern of a printed board is also refined and highly densified, leading to the need for reduction in line width and through hole diameter. In particular, a through hole called a mini via hole, whose diameter is reduced to 0.5 to 0.1 mm as compared with a general value of 0.8 mm, is currently used in a multilayer board for attaining electric connection between major surfaces of the board.

With such reduction in through hole diameter, new techniques are desired in various aspects such as plating, drilling and reliability testing for the through hole.

In general, drilling is not as accurate as process photoetching process, and the through hole tends to deviate from the wiring pattern. A through hole of about 0.8 mm in diameter is provided on its periphery with a sufficiently wide land, so that electrical reliability of the printed board is hardly influenced by slight misregistration of the through hole.

As the land is reduced following reduction of the through hole diameter, however, it is difficult to ensure accuracy for reliably providing a through hole in the land. Thus, electrical reliability of the printed board is disadvantageously lowered by misregistration of the hole, and hence importance of inspection for such misregistration of the through hole is increased.

Such inspection for hole misregistration requires electric inspection as well as appearance inspection. While an inspector for detecting leakage light from plating cracks is known in relation to appearance inspection, various problems arise with the development of a multilayer board. Further, this inspector cannot be applied to inspection of pattern disconnection which is caused by relative misregistration between a through hole and a pattern.

FIGS. 1 and 2 illustrate relative positional relations between a land R and a through hole H. Referring to FIG. 1, the center 0 of the through hole H is registered with the center of the land R, to form an excellent pattern P. Referring to FIG. 2, on the other hand, the center O of the through hole H deviates from the center of the land R, such that a part of the through hole H outwardly projects from the land R. The size of this projecting part is obtained by an angular aperture $\theta$. When the angular aperture $\theta$ is larger than a predetermined reference value, the pattern disconnection is determined to be defective. More particularly, a ring image RP (FIG. 3) is obtained from the image representing the through hole, and an area WR on which the ring image RP overlaps an image RI representing the land is specified. The aperture angle $\theta$ is obtained from the cut portion of the area WR.

As described above, defectiveness of pattern disconnection can be determined by obtaining the angular aperture $\theta$, and there has been proposed a technique which is aimed at automation of such a decision.

However, when defectiveness is determined by measuring the angular aperture $\theta$, it is difficult to detect the so-called "neck disconnection", i.e., disconnection of a land R and a line L as shown in FIGS. 4 and 5. For example, a method of measuring an angular aperture $\theta$, which is disclosed in Japanese Patent Application No. 1-82117 (1989) filed in the name of the applicant, is adapted to obtain an enlarged contour RP by enlarging the contour of a through hole H and observe the state of overlapping of through hole H and a land R, thereby measuring an angular aperture $\theta$ ($=\theta_1+\theta_2$) of a non-overlapping portion. In this case, however, it is impossible to make a decision as to neck disconnection although defectiveness can be decided. Thus, a technique for determining the presence of a neck disconnection on a printed board is not known.

SUMMARY OF THE INVENTION

The present invention is directed to a method of inspecting a printed board on which a wiring pattern including a wiring line is provided and through which a through hole is formed.

According to the present invention, the method includes the steps of: (a) photoelectrically scanning the printed board to obtain a pattern image representing the wiring pattern and a hole image representing an image of the through hole; (b) converting the pattern image into a modified pattern image; (c) converting the hole image into a modified hole image; and (d) analyzing the modified pattern image in connection with the modified hole image to detect a neck disconnection between a land and a line in the wiring pattern.

In one aspect of the present invention, the pattern image is thinned to obtain a thinned pattern image serving as the modified pattern image. Further, a window encompassing the hole image is obtained and used as the modified hole image.

End points of the thinned pattern image are counted to obtain the number of the end points. Neck disconnection between a land and a line of the wiring pattern is determined in connection with the number of the end points.

The end points of the thinned pattern image presents "disconnection" of the original wiring pattern. The number of end points in the window which is set to encompass the hole image contains information as to whether neck disconnection has occurred, so that a neck disconnection can be determined by counting the number of end points.

It is not necessary to rigorously determine the center position of the hole image because neck disconnection of the wiring pattern can be automatically decided with a relatively simple apparatus.

In another aspect of the present invention, the pattern image is converted into a line image representative of the wiring line. The line image serves as the modified pattern image. The hole image is enlarged to obtain an enlarged hole image serving as the modified hole image. It is determined whether the enlarged hole image overlaps the line image, to thereby detect neck disconnection.

Neck disconnection is detected by making a decision as to whether the minimum off-neck width is present in a neck between a line and a land. When the minimum off-neck width is not present, it is decided that there is a neck disconnection. Preferably, the amount of the enlargement of the hole image is determined as a function of the minimum off-neck width.

It is desirable to correctly obtain a boundary between the line image and the land image, in order to reduce an error in the overlapping portion. Therefore, an operator having arms each consisting of a bundle of pixel chains is adapted to obtain a plurality of widths of the line image. It is decided that a part of the operator is on the land image if the values of the widths are different from each other.

Therefore, it is possible to automatically detect neck disconnection. Further, it is possible to correctly recognize the line image by applying the operator to the wiring pattern image, to further improve the effect of the present invention. Because a plurality of widths of the line image are obtained by the respective arms, a boundary between the line image and the land image can be more correctly obtained so that it is possible to more correctly inspect the printed board.

The present invention also provides an apparatus operable to conduct the present method. In the present invention, the term "through hole" encompasses an ordinary through hole of a relatively large diameter and a mini via hole of a relatively small diameter.

Accordingly, an object of the present invention is to provide a method of and apparatus for inspecting a printed board in which neck disconnection in a wiring pattern is correctly and automatically detected.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6A is a block diagram showing the structure of an apparatus according to a first preferred embodiment of the present invention;

FIG. 6B is a block diagram showing the structure of an electronic part of the apparatus according to the first preferred embodiment of the present invention;

FIGS. 11(a) and 11(b) illustrate a thinning operation;

FIG. 12 illustrates end point detection;

FIG. 20A illustrates thinning of wiring patterns without neck disconnection;

FIG. 20B illustrates thinning of wiring patterns with neck disconnection;

FIG. 32 is a diagram showing the structure and the operation of a two-dimensional expansion part 136a;

DESCRIPTION OF THE PREFERRED EMBODIMENTS

First Preferred Embodiment

A. Overall Structure and Schematic Operation

Figure 1:
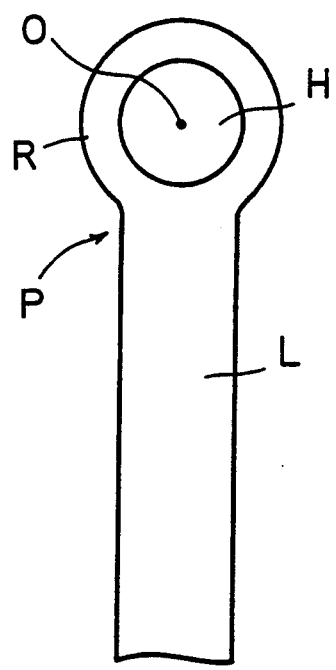
FIGS. 1 to 5 illustrate problems of background art.
Figure 2:
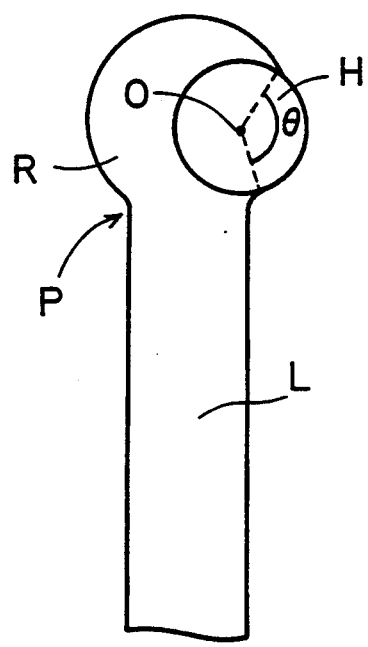
Figure 3:
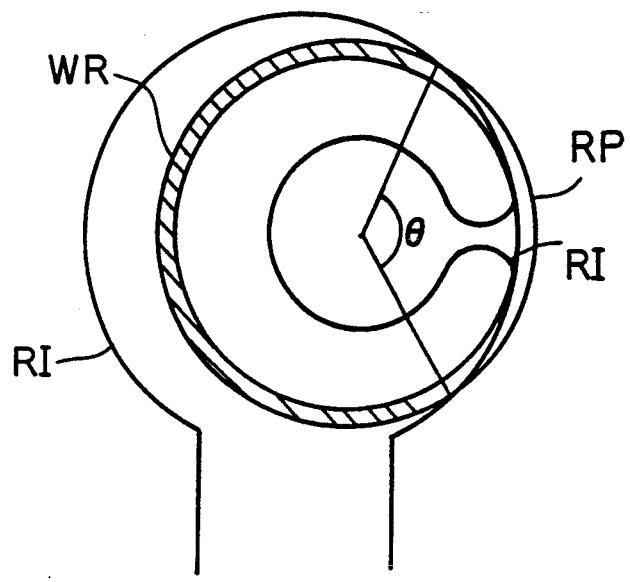
Figure 4:
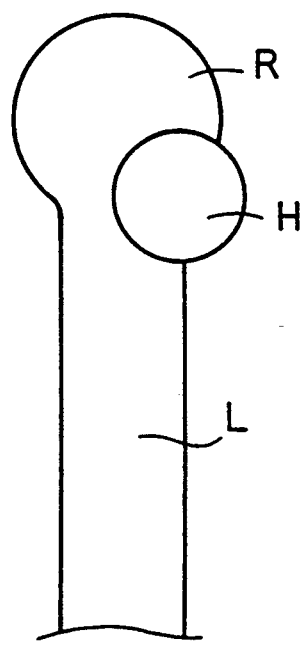
Figure 5:
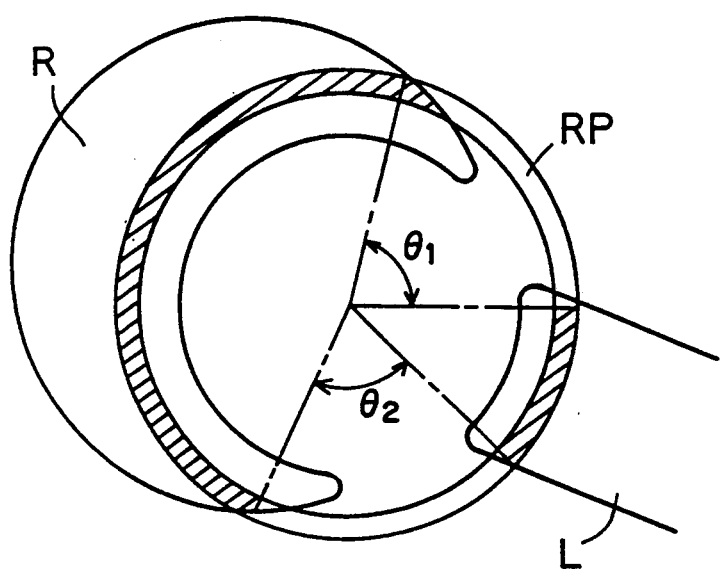

FIG. 6A is a block diagram showing the overall structure of a pattern inspection apparatus according to a first preferred embodiment of the present invention.

A printed board 11 to be inspected is placed on a stage 10. The printed board 11 is fed in a carriage direction Y while the image of the printed board 11 is read with an image reader 20 for each scanning line defined in the direction X. The image reader 20 has a plurality of CCD linear image sensors each having thousands of elements in the line direction X, and is operable to read the pattern of the printed board 11 for each pixel. The image data obtained in the image reader 20 are fed to binarizing circuits 21a and 21b. The binarizing circuit 21a generates a hole image original signal $HIS_0$ while the binarizing circuit 21b generates a pattern image original signal $PIS_0$, details of which signals $HIS_0$ and $PIS_0$ will be described later. Both of the signals $HIS_0$ and $PIS_0$ are input to a pattern inspection circuit 30.

The pattern inspection circuit 30, which has a function as described below, inspects the wiring pattern including lands, and relative positional relation between the lands and through holes. The result of the inspection is delivered to a central processing unit (MPU) 50.

The MPU 50 controls the entire apparatus through a control system 51. The control system 51 generates X—Y addresses for specifying addresses of the image data obtained in the pattern inspection circuit 30. The control system 51 also supplies the X-Y addresses to a stage driving system 52, to control a carrying mechanism for the stage 10.

A CRT 60 receives a command from the MPU 50 and displays various results of operation such as a hole image. A keyboard 70 is used for inputting various instructions to the MPU 50.

A defect confirming apparatus 81, a defect removing apparatus 82 and a defect position marking apparatus 83 etc. are arranged in an option part 80. The defect confirming apparatus 81 is adapted to display detected defects on the CRT 60 in the form of an enlarged image. The defect removing apparatus 82 is adapted to carry a printed board 11 having a defect and to a tray for defects. The defect position marking apparatus 83 is adapted to directly mark a defective portion on the printed board 11 or mark a point on a sheet corresponding to the portion. These apparatuses are optional.

B. Optical Reading System

Figure 7A:
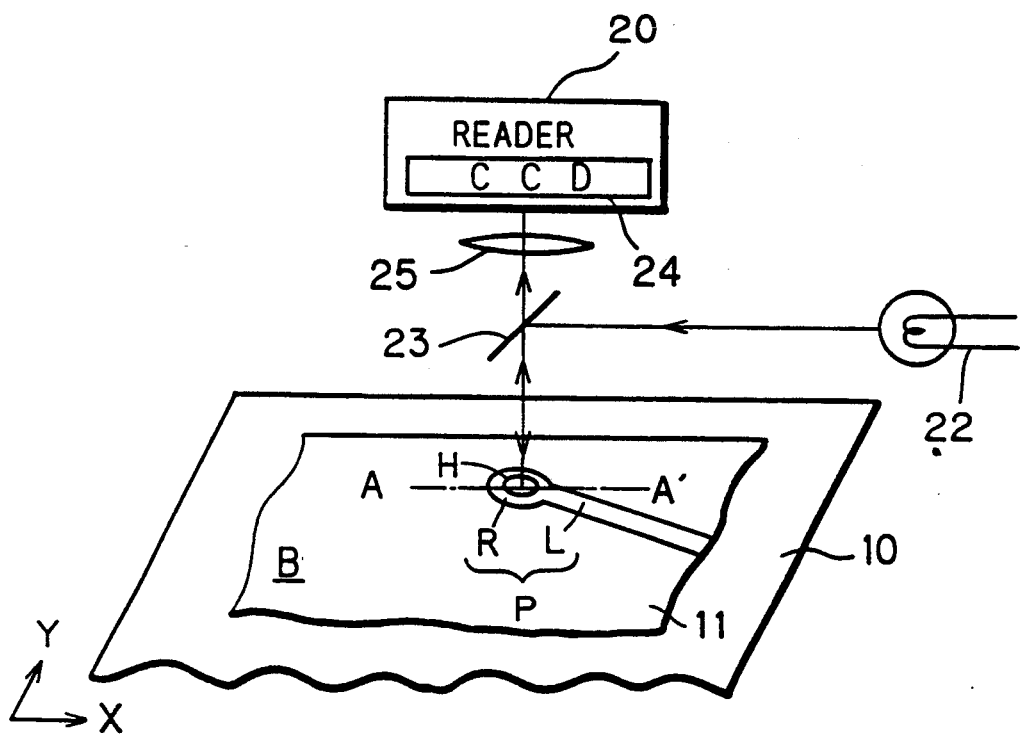
FIGS. 7A and 7B are conceptual diagrams showing image reading by photoelectric scanning.

FIG. 7A illustrates an example of optical reading systems which can be employed in the present invention. The optical reading system comprises the stage 10 shown in FIG. 6A and the image reader 20.

Referring to FIG. 7A, light from a light source 22 is reflected by a half mirror 23, and applied onto the printed board 11 on the stage 10. The printed board 11 is provided with a base plate B serving as an underlayer, a wiring line L, a through hole H and a land R in which an opening of the through hole H is present. Light reflected from the printed board 11 passes through the half mirror 23, and is incident upon the CCD 24 in the reader 20 through a lens 25. The CCD 24 reads for each scanning line the reflected light from the base plate B, the wiring line L, the through hole H and the land R on the printed board 11 which is fed in the carriage direction Y.

Figure 8:
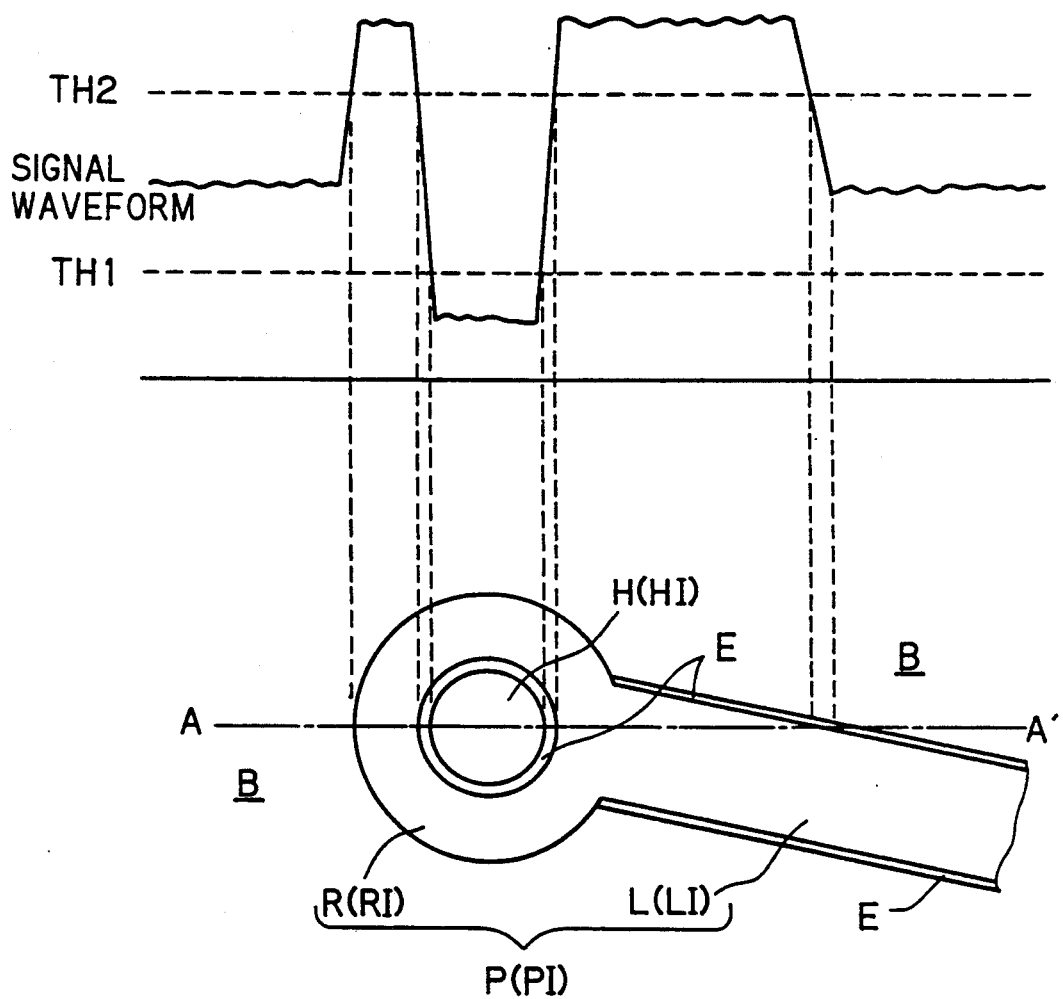
FIG. 8 illustrates a signal waveform obtained in the first preferred embodiment and a pattern obtained by synthesizing respective signal levels.

FIG. 8 illustrates a graph showing a signal waveform obtained along a line A—A' in FIG. 7A and an exemplary pattern obtained by synthesizing respective signal waveforms for a two-dimensional area on the printed board 11.

As shown in the signal waveform of FIG. 8, the intensity of the reflected light is relatively weak in the base plate B, and the signal level thereof is between threshold values TH1 and TH2 (TH1<TH2). Since the wiring pattern P (the line L and the land R) is made of a metal such as copper, the intensity of the reflected light is large on the wiring pattern, and the signal level thereof exceeds the higher threshold value TH2. In the through hole H, substantially no light is reflected and a signal whose level is below the threshold value TH1 is obtained. Edges E are present between the through hole H and the land R as well as between the line L and the base B. Because of irregularities and inclination in the edges E, reflected light levels in these portions vary between the threshold values TH1 and TH2, so that quantization errors are often caused.

Signals from the image reader 20 are binarized in the binarizing circuits 21a and 21b shown in FIG. 6A, using the threshold values TH1 and TH2 respectively. The binarizing circuit 21a generates a signal representing a hole image HI corresponding to the through hole H, while the binarizing circuit 21b generates another signal representing a pattern image PI corresponding to the wiring patfern P consisting of the line L and the land R. These signals representing the images HI and PI are subjected to the processing steps described below.

Figure 7B:
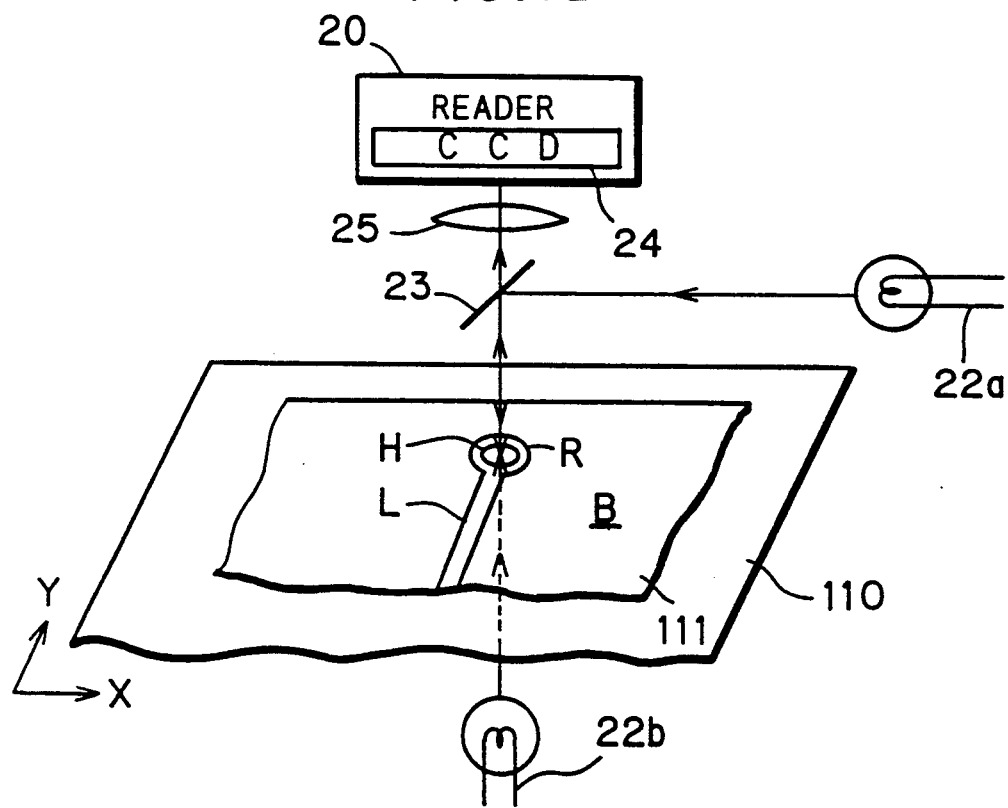

FIG. 7B shows another example of the reading optical system. Similar to the system shown in FIG. 7A, light from a light source 22a is applied onto the printed board 11 and a reflected light is incident on a CCD 24 in an image reader 20 through a half mirror 23 and a lens 25. In this example, another light source 22b is provided at the rear side of a stage 10, so that light passing through a through hole H is also received by the CCD 24. Therefore, the signal obtained in the CCD 24 is at the highest level in the through hole H, at an intermediate level in a wiring pattern P consisting of a line L and a land R, and at relatively low levels in a base plate B and edges E.

Alternatively, at least two linear arrays of CCDs 24 may be prepared. In this case, the wiring pattern P consisting of the line L and the land R is detected by the combination of the light source 22a and one of the two linear arrays of CCDs 24, while the through hole H is detected by the combination of the light source 22b and the other of the two linear arrays of CCDs 24. The image signals are delivered to respective binarizing circuits provided in a subsequent stage.

C. Pattern Inspection Circuit

FIG. 6B is a block diagram showing the internal structure of the pattern inspection circuit 30 shown in FIG. 6A.

The primary hole image signal $HIS_0$ and the primary pattern image signal $PIS_0$ obtained in the binarizing circuits 21a and 21b shown in FIG. 6A are supplied to noise filters 32a and 32b, respectively through an interface 31. The noise filters 32a and 32b remove noises through smoothing processing etc., to generate a hole image signal HIS and a pattern image signal PIS, respectively.

Both the hole image signal HIS and the pattern image signal PIS are supplied to each of a comparative check circuit 33, a DRC (design rule check) circuit 34, and a through hole inspection circuit 35.

The comparative check circuit 33 is adapted to compare the hole image signal HIS and the pattern image signal PIS with image signals obtained for a reference printed board previously prepared, for specifying portions of the signals HIS and PIS which are different from the reference printed board. The reference printed board is of the same type as the printed board 11 to be inspected and has been previously determined to be nondefective.

The DRC circuit 34 is adapted to extract features of the pattern P, which is provided on the printed board 11, such as the line width, the pattern angle, continuity and the like to decide whether the features deviate from values on design, thereby detecting defective portions on the printed board 11.

D. Through Hole Inspection Circuit

(D-1) Outline

Before explaining structures and operations of respective parts of the through hole inspection circuit 35, the outline thereof is now described.

Figure 9A:
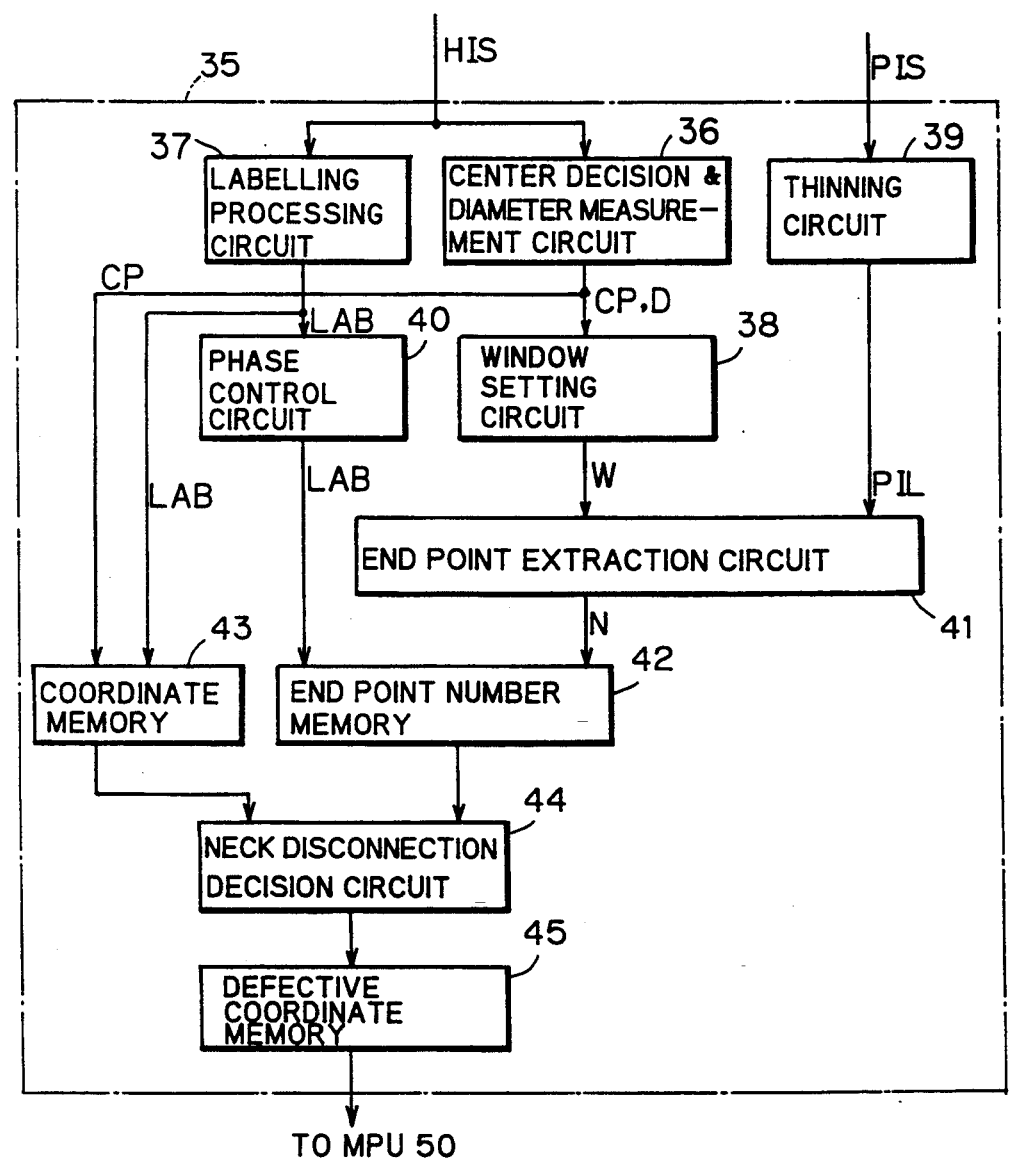
FIG. 9A is a block diagram showing a through hole inspection circuit.
Figure 9B:
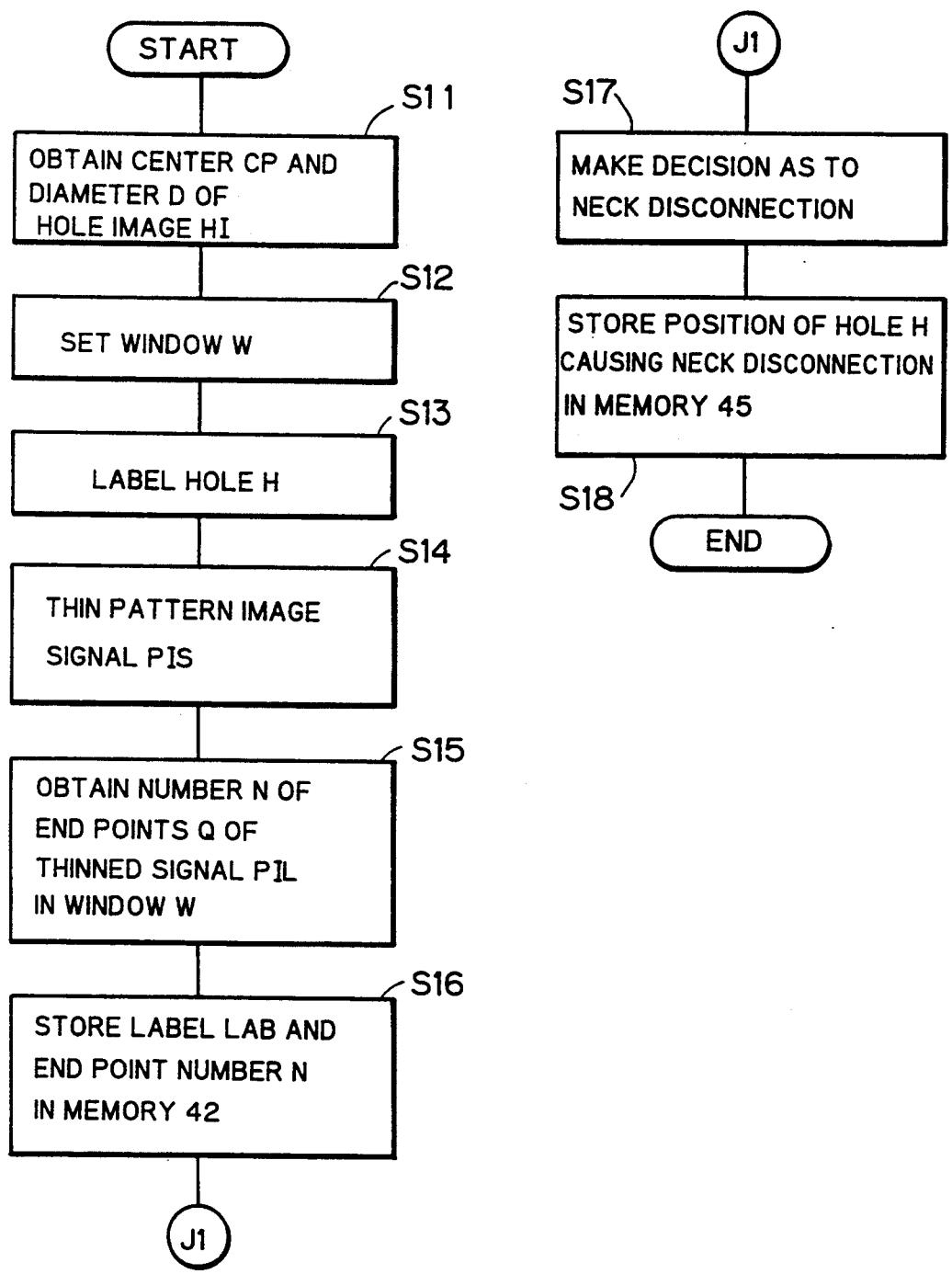
FIG. 9B is a flow chart showing the operation of the apparatus according to the first preferred embodiment of the present invention.

FIG. 9A is a block diagram showing the internal structure of the through hole inspection circuit 35 illustrated in FIG. 6B, and FIG. 9B is a flow chart showing flow of a pattern inspection process of the printed board which is carried out with the structure shown in FIG. 9A.

A center decision and diameter measurement circuit 36 shown in FIG. 9A is adapted to generate information CP (hereinafter referred to as "center CP") as to the central position of the hole image HI and information as to its size such as a diameter D, for example, in correspondence to the step S11 of FIG. 9B.

The center CP may be represented by values of coordinates (X, Y). Alternatively, the center CP may be represented by providing a certain value of bit to an element in a position matrix [X, Y]. In any case, it is not requisite to correctly obtain the center CP in the present invention, as described below.

Figure 10:
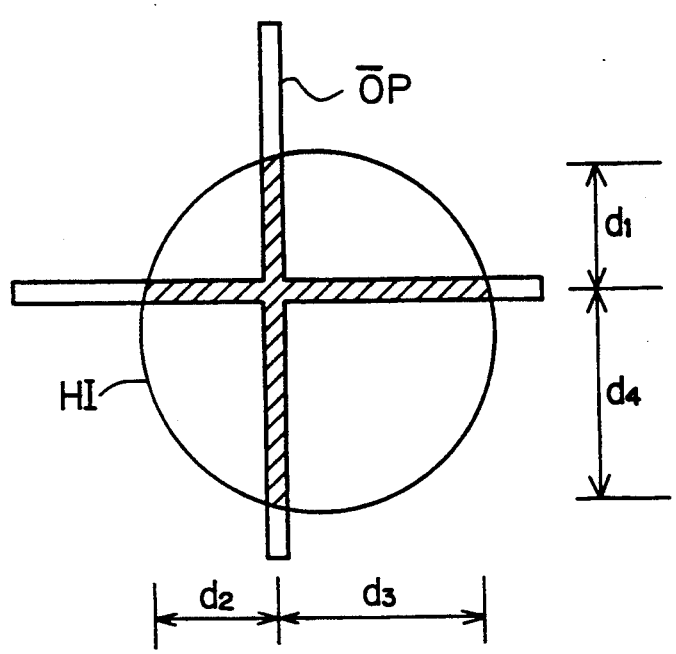
FIG. 10 illustrates a cross operator.

The aforementioned circuit 36 may include a structure forming a cross operator, for example. Referring to FIG. 10, a cross-shaped space operator (cross operator) OP is applied to a hole image HI which is obtained from the hole image signal HIS, to compare lengths $d_1$ to $d_4$ of portions where four arms of the operator OP overlap with the hole image HI, thereby obtaining information as to the center and the diameter of the hole image HI. Alternatively, the background of the hole image HI may be expanded using expansion processing as described below for equivalently reducing the hole image HI and obtaining a center CP, thereby obtaining the diameter D from the required repetition number of reduction.

The center CP and the diameter D of the hole image HI obtained in the aforementioned manner are inputted in a window setting circuit 38. This circuit 38 generates a window W having a size required for determining neck disconnection, such as dimensions of 4D×4D, for example, from the center CP. More particularly, a rectangular region which is defined by the following four points:

$W_1 = (x_c + 2D, y_c + 2D)$ $W_2 = (x_c 2D, y_c - 2D)$ $W_3 = (x_c - 2D, y_c + 2D)$ $W_4 = (x_c - 2D, y_c - 2D)$ is set as the window W, assuming that CP=$(x_c, y^c)$, for example. The center of the rectangle coincides with the center CP of the hole image HI. This processing corresponds to the step S12 of FIG. 9B.

The hole image signal HIS is also inputted in a labelling processing circuit 37. Different labels .LAB are assigned to respective hole images HI which are created from the hole image signal HIS, to be distinguished from each other. This processing corresponds to the step S13 of FIG. 9B.

On the other hand, the pattern image signal PIS is inputted in a thinning circuit 39, to be converted to a thinned pattern signal PIL. This corresponds to the step S14 of FIG. 9B. As to the thinning operation, a mask consisting of a 3×3 pixel matrix shown in FIG. 11(a) is employable. Namely, 3×3 pixels in the pattern image signal PIS coincides with the pattern in FIG. 11(a), the pattern image is thinned for one pixel by inverting the binary level of the object pixel from "1" to "0" as shown in FIG. 11(b). This process is performed on all pixels from upper, lower, left and right directions. Alternatively, thinning accompanied by vectoring may be carried out.

Referring again to FIG. 9A, the window W and the thinned signal PIL are inputted in an end point extraction circuit 41. It carries out processing of the step S15 to obtain the number N of end points of the thinned pattern image, which end points are $Q_1$ through $Q_4$ in FIG. 20A, for example. Since a determination of neck disconnection may be sufficiently made by inspecting a portion around the land R and the through hole H, the number N of the end points is counted in the window W.

End point extraction may be carried out with a mask consisting of a 3×3 pixel matrix shown in FIG. 12, for example. Namely, when the binary levels on the 3×3 pixels around an object pixel of thinned image data coincides with any one of eight patterns shown in FIG. 12, the object pixel is recognized as an end point.

The number N of the end points is stored in an end point number memory 42, with an address indicated by the label LAB in which delays in the labelling processing step S13 and the end point extraction processing step S15 are compensated for in a phase control circuit 40. The step S16 corresponds to this process.

On the other hand, the center position CP is stored in a coordinate memory 43 with an address indicated by the label LAB. Thus, it is possible to correlate a hole H which is at a certain position with the number N through the label LAB after counting the number N of the end points as to all holes H of the printed board 11, for example. A neck disconnection decision circuit 44 decides whether the printed board 11 has a neck disconnection with reference to the number N (the step S17), so that the coordinates of a hole H which is determined to have neck disconnection are stored in a defective coordinate memory 45 (the step S18).

Thus, the through hole inspection circuit 35 detects neck disconnection between a land and a line of the wiring pattern, to decide whether there is a defect.

The details of the neck disconnection detection are as follows:

(D-2) Labelling Processing

Figure 13:
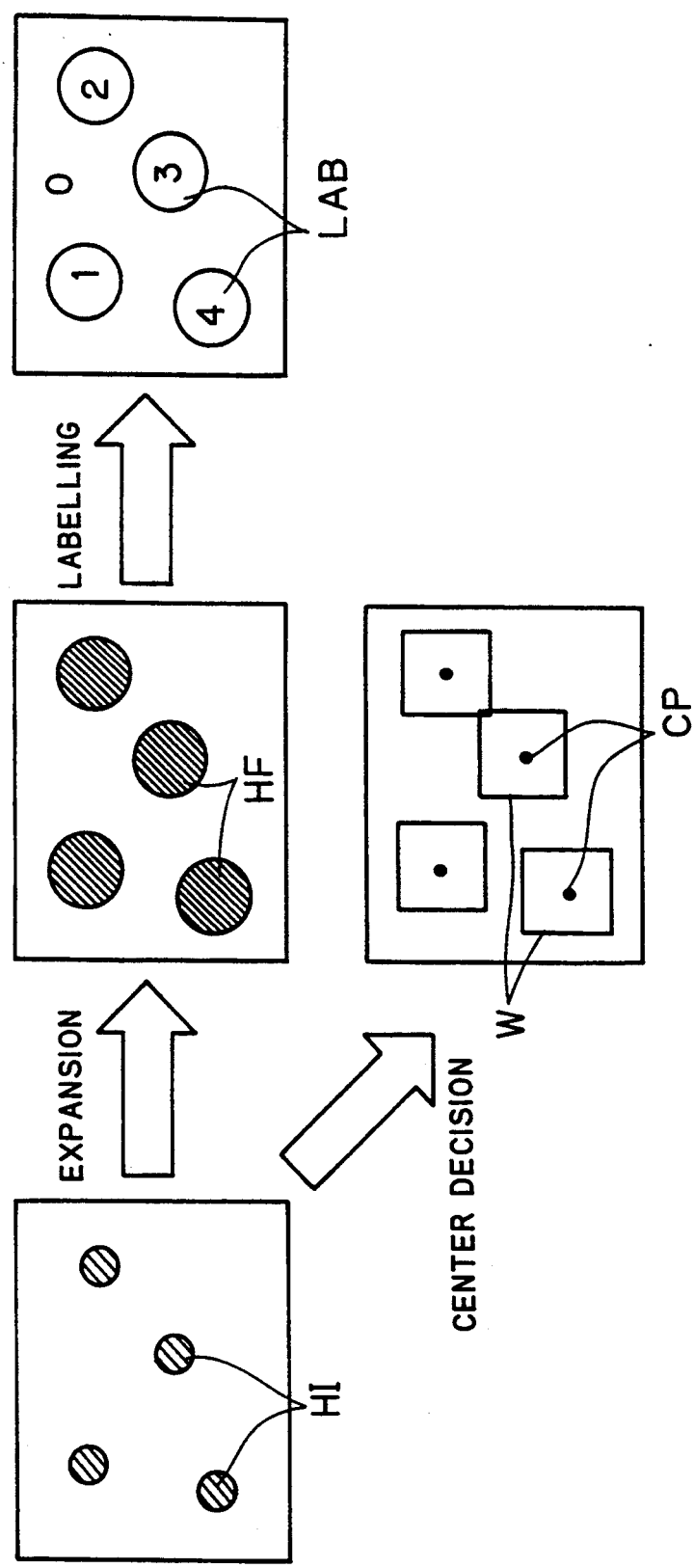
FIG. 13 illustrates a process of labelling.
Figure 15:
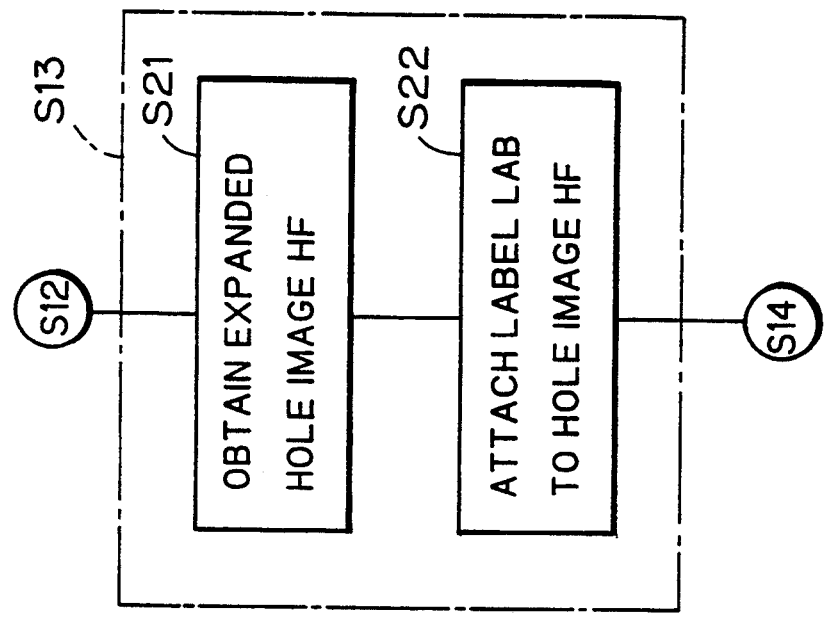
FIG. 15 is a flow chart showing operation flow of the labelling processing circuit.
Figure 14:
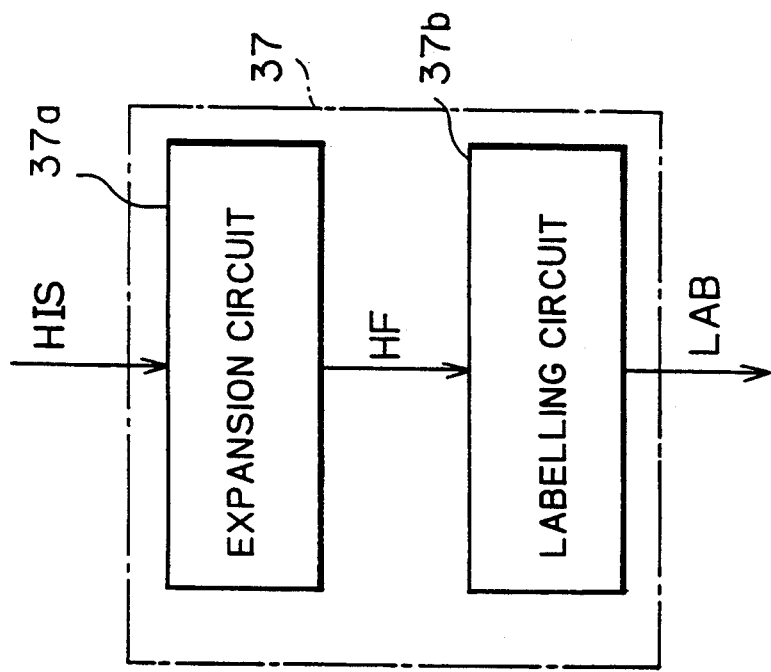
FIG. 14 is a block diagram showing the structure of a labelling processing circuit.
Figure 16:
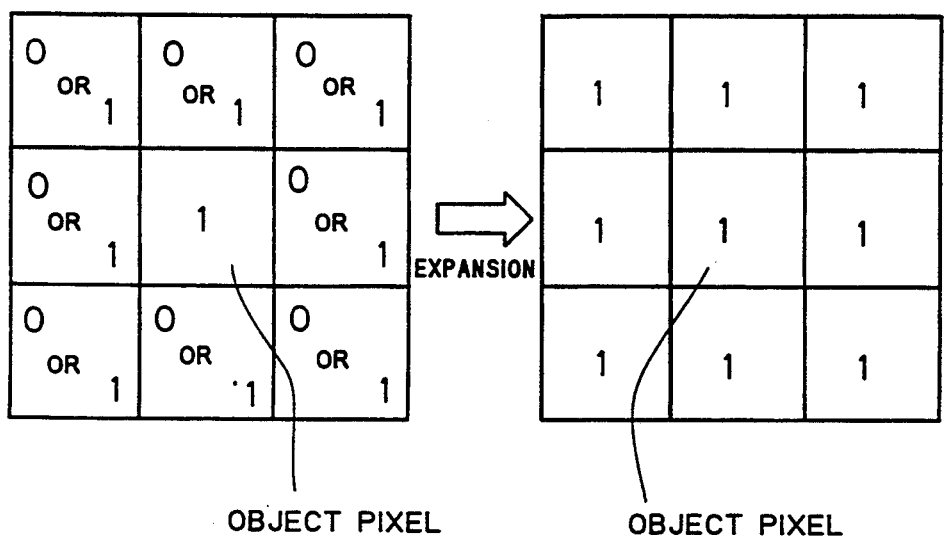
FIG. 16 illustrates expansion processing.

FIG. 13 illustrates the outline of the labelling processing, FIG. 14 is a block diagram of the labelling processing circuit 37, and FIG. 15 is a flow chart of the circuit 37, respectively. The hole images HI created by the hole image signal HIS are inputted in an expansion circuit 37a, so that expanded hole images HF are obtained (the step S21). This expansion processing may be carried out by forcing respective binary levels on the pixels around an object pixel to become "1" when the binary level on the object pixel is "1" in a 3×3 pixel matrix as shown in FIG. 16, for example.

Figure 17:
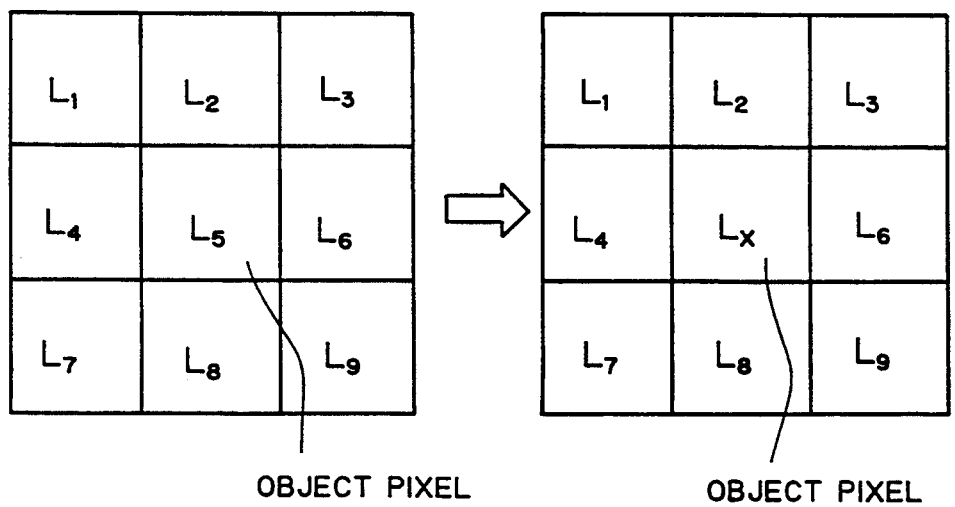
FIG. 17 illustrates a pixel matrix employed in the process of labelling.

Then, the expanded hole images HF are inputted in a labelling circuit 37b, to be provided with the labels LAB (the step S22). Although the aforementioned expansion processing is not necessarily required for this labelling operation, it is preferable to expand the hole images to certain degrees of sizes for the purpose of simplifying the processing. In the labelling process, different labels $L_i$ for $i=$, 2, . . . are defined by positive serial integers and are assigned to respective expanded hole images HF. A label of "0" is provided to the background area. In order to avoid that a label is provided to a pseudo-hole image which may appear in the image plane caused by quantization errors or the like, the labels on respective pixels are corrected. More particularly, respective pixels provided with the labels are scanned, and if there are pixels which are adjacent to an object pixel and whose levels are positive integers smaller than the label on an object pixel, the label of the object pixel is changed to the label which is the minimum among the adjacent pixels. The process is illustrated in FIG. 17, and the label $L_5$ of the object pixel is changed to the minimum label $L_x$ among the positive ones of the adjacent pixels $L_1$ through $L_9$. Through this process, the label of a pseudo-hole image adjacent to one of the actual hole images is equalized with one of the actual hole images, so that the original label on the pseudo-hole image disappears.

The labels LAB assigned to respective expanded hole images and the background area are shown in FIG. 13 together with windows W for respective hole images.

(D-3) End Point Extraction Circuit

Figure 19:
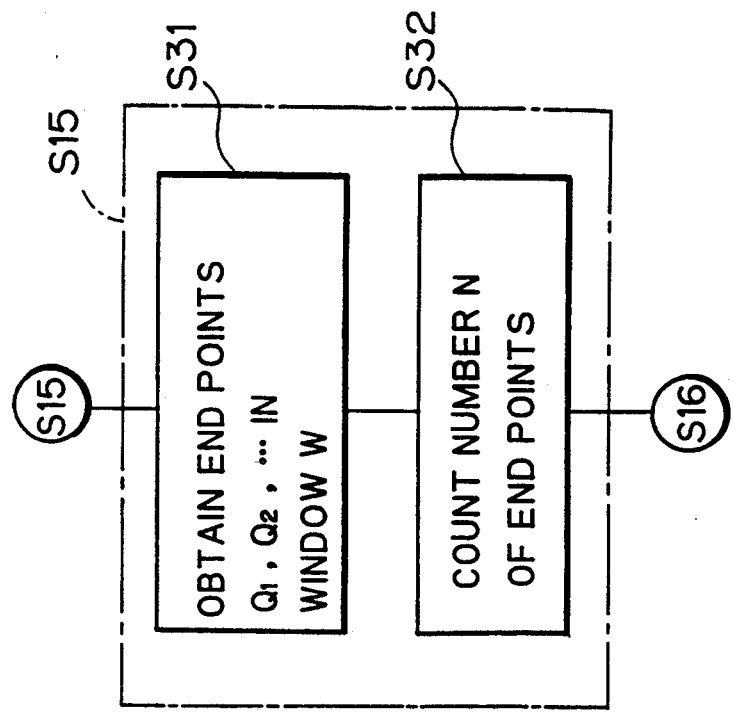
FIG. 19 is a flow chart showing operation flow of the end point extraction circuit.
Figure 18:
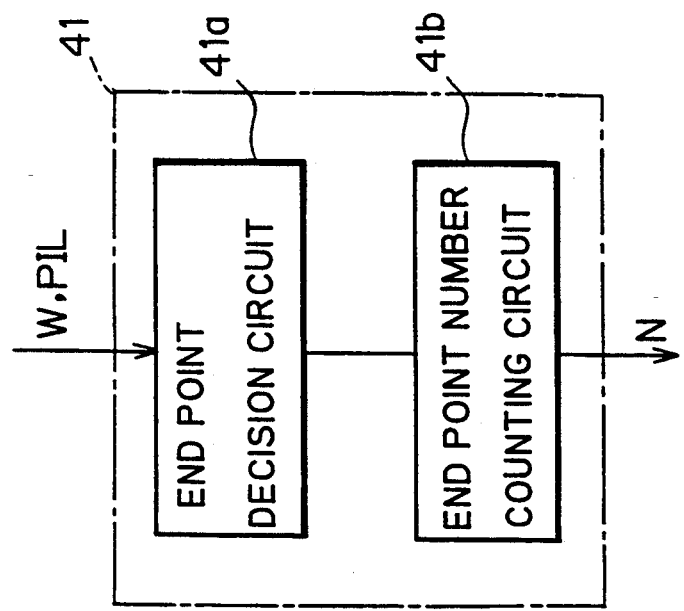
FIG. 18 is a block diagram showing the structure of an end point extraction circuit.

FIG. 18 is a block diagram showing the structure of the end point extraction circuit 41, and FIG. 19 is a flow chart of the circuit 41. An end point decision circuit 41a obtains end points $Q_1$, $Q_2$, . . . of a pattern PL, which has been subjected to the thinning process with the 3×3 mask shown in FIGS. 11(a) and 11(b). The extraction of the end points $Q_1$, $Q_2$, . . . is conducted in each window W and is attained using the 3×3 mask shown in FIG. 12 (the step S31). An end point number counting circuit 41b obtains the number N of the end points $Q_1$, $Q_2$, . . . (the step S32).

FIGS. 20A and 20B show an example of the end point extraction. In respective diagrams, the upper ones show relations between actual wiring patterns P and through holes H, while the lower ones show thinned patterns PL and end points $Q_1$, $Q_2$, . . . (shown with solid triangles in the diagrams), respectively. The values N represent numbers of the end points of the patterns.

(D-4) Neck Disconnection Decision Circuit

Figure 22:
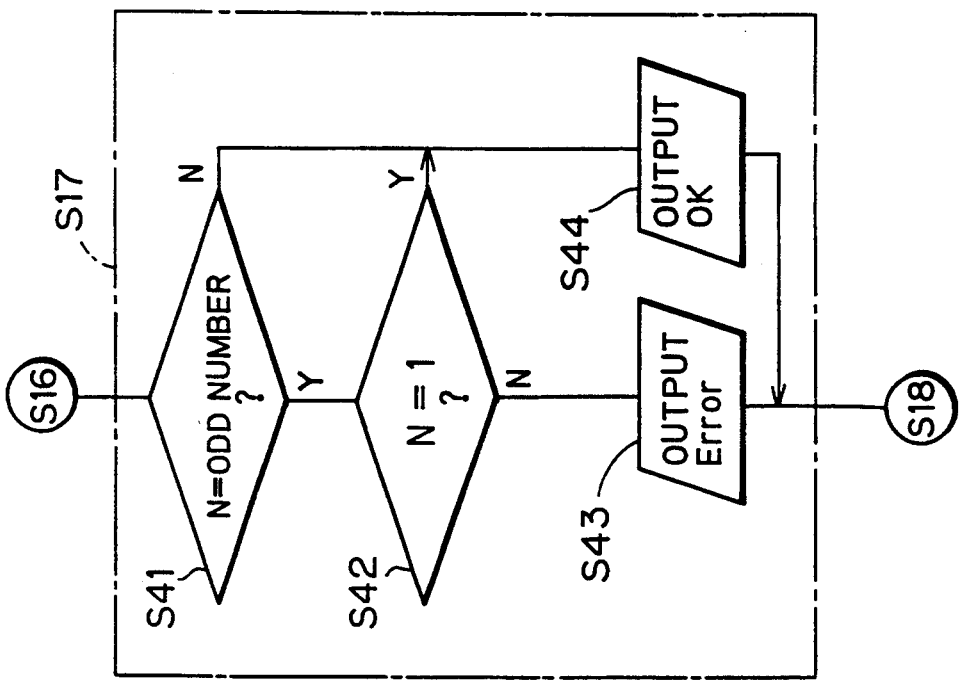
FIG. 22 is a flow chart showing flow of the neck disconnection decision circuit.
Figure 21:
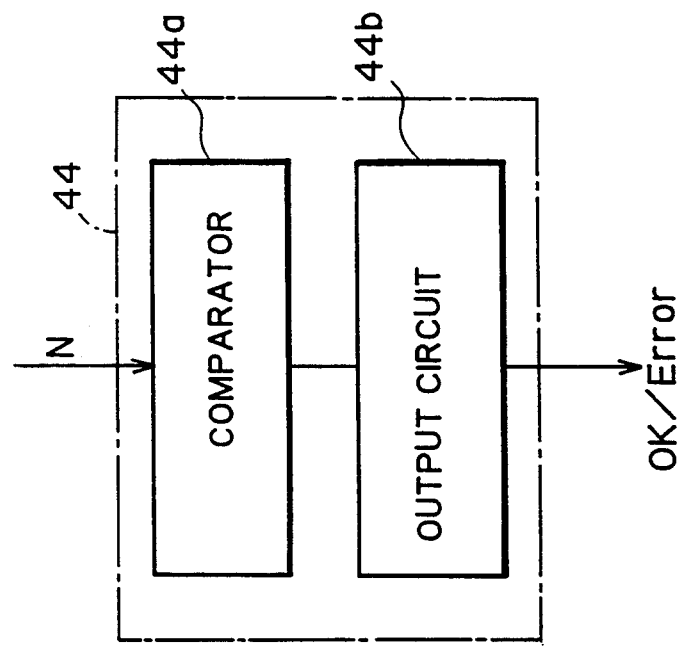
FIG. 21 is a block diagram showing the structure of a neck disconnection decision circuit.

FIG. 21 is a block diagram showing the structure of a neck disconnection decision circuit 44, and FIG. 22 is a flow chart of the circuit 44. A comparator 44a is adapted to receive the number N of the end points and compare the same with predetermined reference values thereby making a decision as to the presence neck disconnection, in correspondence to the steps S41 and S42. An output circuit 44b is adapted to output OK/Error in response to the decision, in correspondence to the steps S43 and S44.

FIG. 20A shows cases including no neck disconnection, and FIG. 20B shows cases including neck disconnection. As understood from FIG. 20A, $N=0$ when the wiring patterns P are normal and the through holes H are substantially correctly registered with the wiring patterns P, while $N=2$ when the through holes H are separated from necks to cause misregistration. When pattern disconnection which is not neck disconnection is caused due to errors other than misregistration of the through hole H, the number N is an even number. In principle, therefore, it is possible to decide that no neck disconnection is caused if N is an even number (the step S41). Also when $N=1$, the sign OK is output since no neck disconnection is caused (the steps S42 and S44).

On the other hand, neck disconnection is caused when the through hole H covers a portion around a neck as in the case of $N=3$ shown in FIG. 20B, for example. When pattern disconnection is caused by errors other than misregistration of the through hole H, an even number of end points is obtained. In principle, therefore, it is possible to determine that neck disconnection is present if N is an odd number larger than one. Although there is a possibility that an even number N is obtained when a neck disconnection is present as in the case of $N=4$ shown in FIG. 20B, such a case rarely occurs and may be neglected. Therefore, the signal error is output if N is an odd number larger than one (the step S43).

E. Modifications (1) The window W is not restricted to the aforementioned rectangular configuration but may be a circular region, and an expansion-processed hole image WF may be utilized as such a circular region.

(2) It is possible to arbitrarily determine a criterion for determining neck disconnection from the number N.

(3) An inspection which is based on an angular aperture $\theta$ may be employed in addition to the aforementioned neck disconnection inspection.

Second Preferred Embodiment

F. Basic Idea

Before explaining a second preferred embodiment of the present invention in detail, the basic idea of the embodiment is now described.

Figure 48:
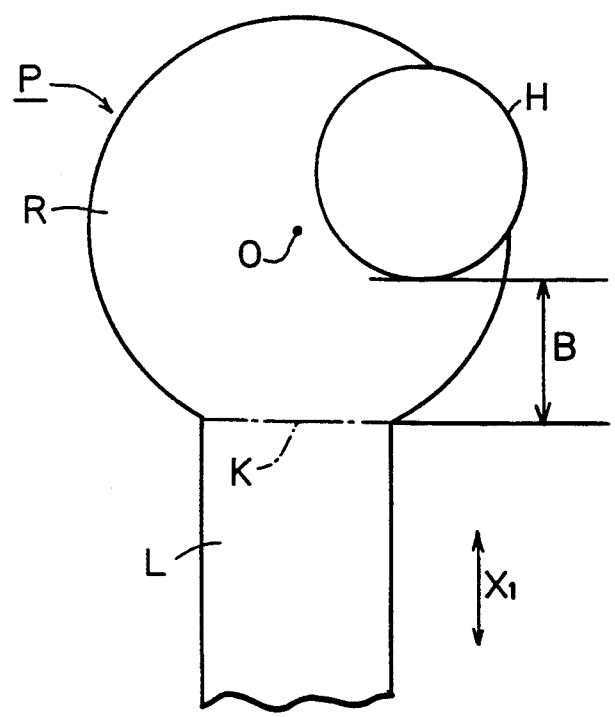
FIGS. 48 through 51 are explanatory diagrams showing the outline of the second preferred embodiment of the present invention.
Figure 49:
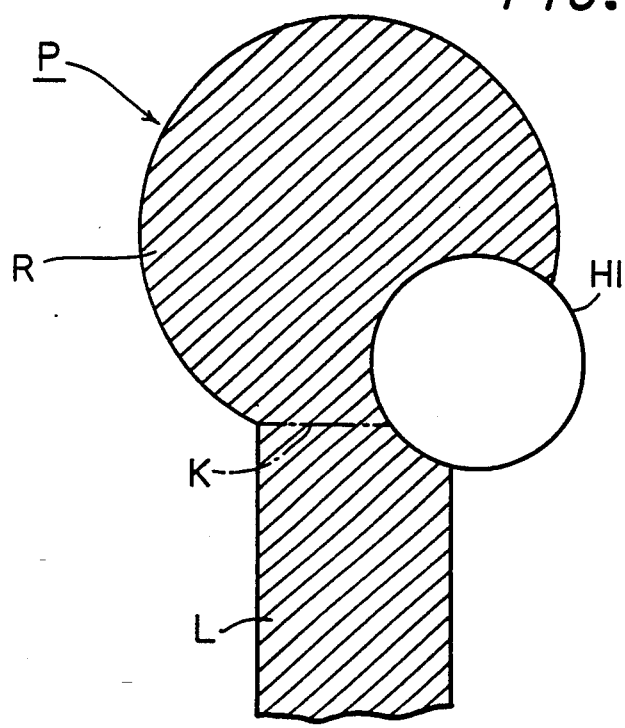

FIGS. 48 and 49 show such cases in which lands R and lines L cause pattern disconnection resulting from misregistration of holes H. FIG. 48 shows a case when pattern disconnection is caused not on a virtual neck line K corresponding to a connected portion between the land R and the line L but only in the land R, while FIG. 49 shows a case where pattern disconnection at the neck, i.e., neck disconnection is caused on a neck line K.

In the case of FIG. 48, no pattern disconnection is caused on the line L because pattern disconnection is not caused on the neck line K. In other words, a required annular width is ensured in the vicinity of the neck line K.

In the case of FIG. 49, on the other hand, pattern disconnection reaches the line L because the pattern connection (neck disconnection) is caused on the neck line K, and the required annular width is not present in the vicinity of the neck line K.

Therefore, it is understood that a decision may be made as to whether the required minimum annular width is present in the vicinity of the neck line K, to decide whether neck disconnection is caused. According to the second preferred embodiment, an annular width B on the neck (hereinafter referred to as "off-neck width") is measured and it is determined from the value of the off-neck width whether a sufficient land is present around the through hole.

The off-neck width B is defined as a distance measured in parallel in a running direction $x_1$ of a line L, i.e., a distance between a point, which is closest to the line L, of a hole H and a neck line K or extension thereof. Referring to FIG. 48, for example, the off-neck width B is measured as shown in this figure because the hole H does not intersect with the neck line K.

Referring to FIG. 49, on the other hand, the off-neck width B is zero since the hole H intersects with the neck line K.

Therefore, it is possible to determine neck disconnection by selecting a positive threshold value for the off-neck width B, which is the criterion for a detection of neck disconnection.

Measurement of such an off-neck width B, the detail of which is described later, is performed in accordance with a flow chart shown in FIG. 23.

First, a land image RI and a line image LI, which are binarized images corresponding to a land R and a line L, are obtained at the step T100. These are obtained to be included in a pattern image PI, which is a binarized image corresponding to a wiring pattern P. Further, a binarized image corresponding to a hole H is also obtained as a hole image HI.

Then, the hole image HI is enlarged to obtain an enlarged hole image EI at the step T200. At this time, enlargement is performed by a prescribed amount corresponding to a threshold value for an off-neck width B.

Figure 50:
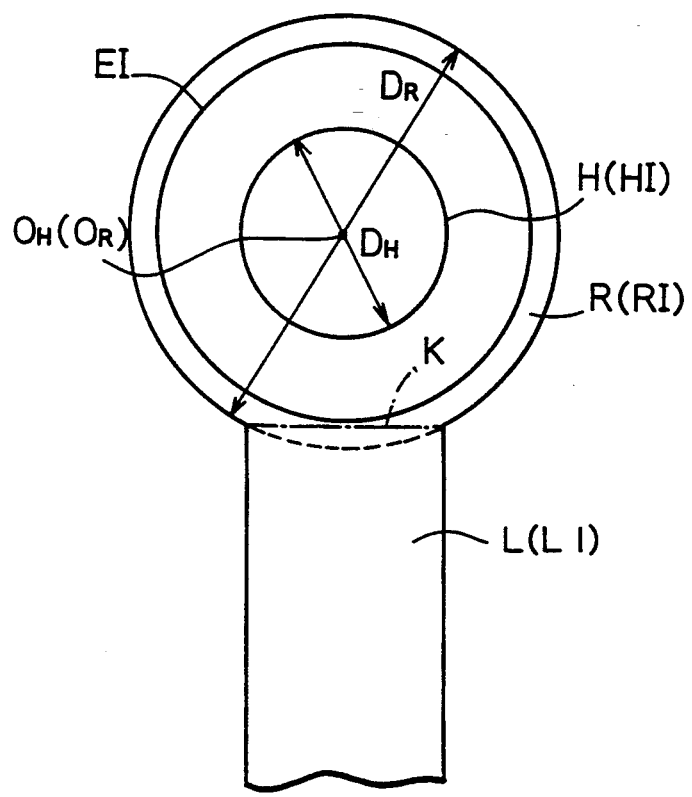

In general, a diameter $D_R$ of a land R and a diameter $D_H$ of a hole H are predetermined on design of a printed board. When a hole H is correctly formed as shown in FIG. 50, i.e., when a center $O_R$ of a land R coincides with a center $O_H$ of the hole H, an enlarged hole image EI and a line image LI hardly overlap with each other if the hole image HI is enlarged by a width less than about $(D_R-D_H)/2$.

Figure 51:
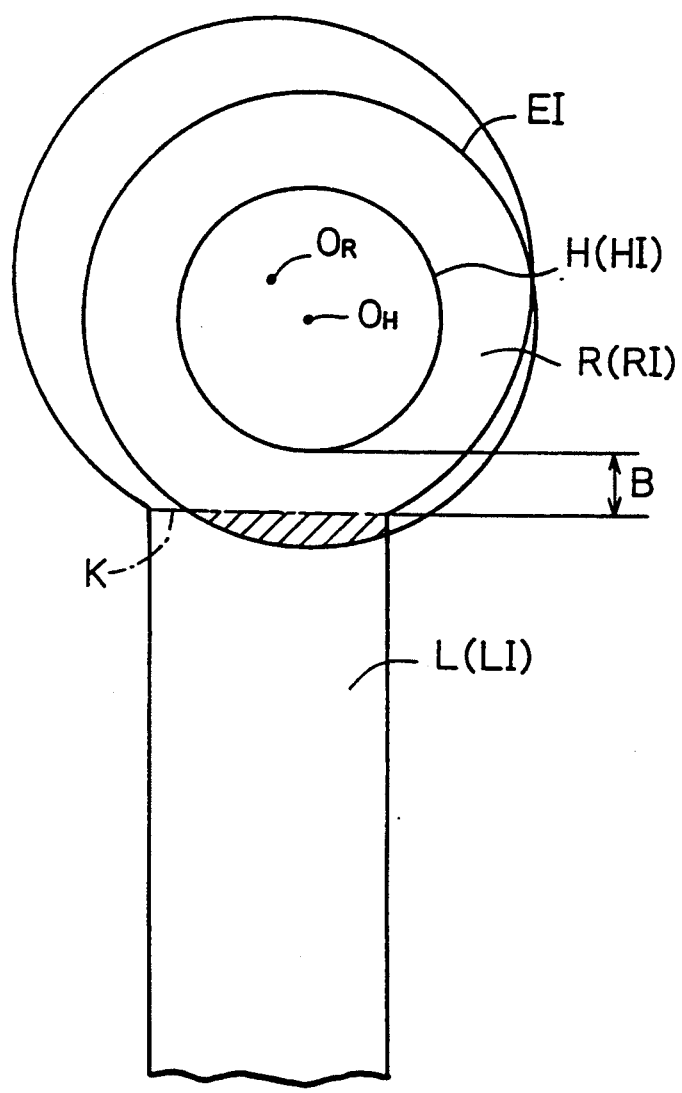

When a center $O_R$ of a land R does not coincide with a center $O_H$ of a hole H as shown in FIG. 51, however, an enlarged hole image EI and a line image LI greatly overlap with each other even if a hole image HI is enlarged by a width less than $(D_R-D_H)/2$. This is because an off-neck width B is so small that a sufficient size land is not present, as described above. Hence, an allowable minimum value or a threshold value $\alpha$ of the off-neck width is determined in the range from zero to $(D_R-D_H)/2$, and an enlargement width is defined by the threshold value $\alpha$. The hole image HI is enlarged by the enlargement width $\alpha$ to obtain an enlarged hole image EI. When an area on which the enlarged hole image EI overlaps the line image LI is larger than a predetermined threshold area value, it is decided that there is a neck disconnection on the neck (the step T300 in FIG. 23). The "prescribed amount" in the step T200 in FIG. 23 corresponds to the enlargement width $\alpha$.

G. Overall Structure

Figure 24:
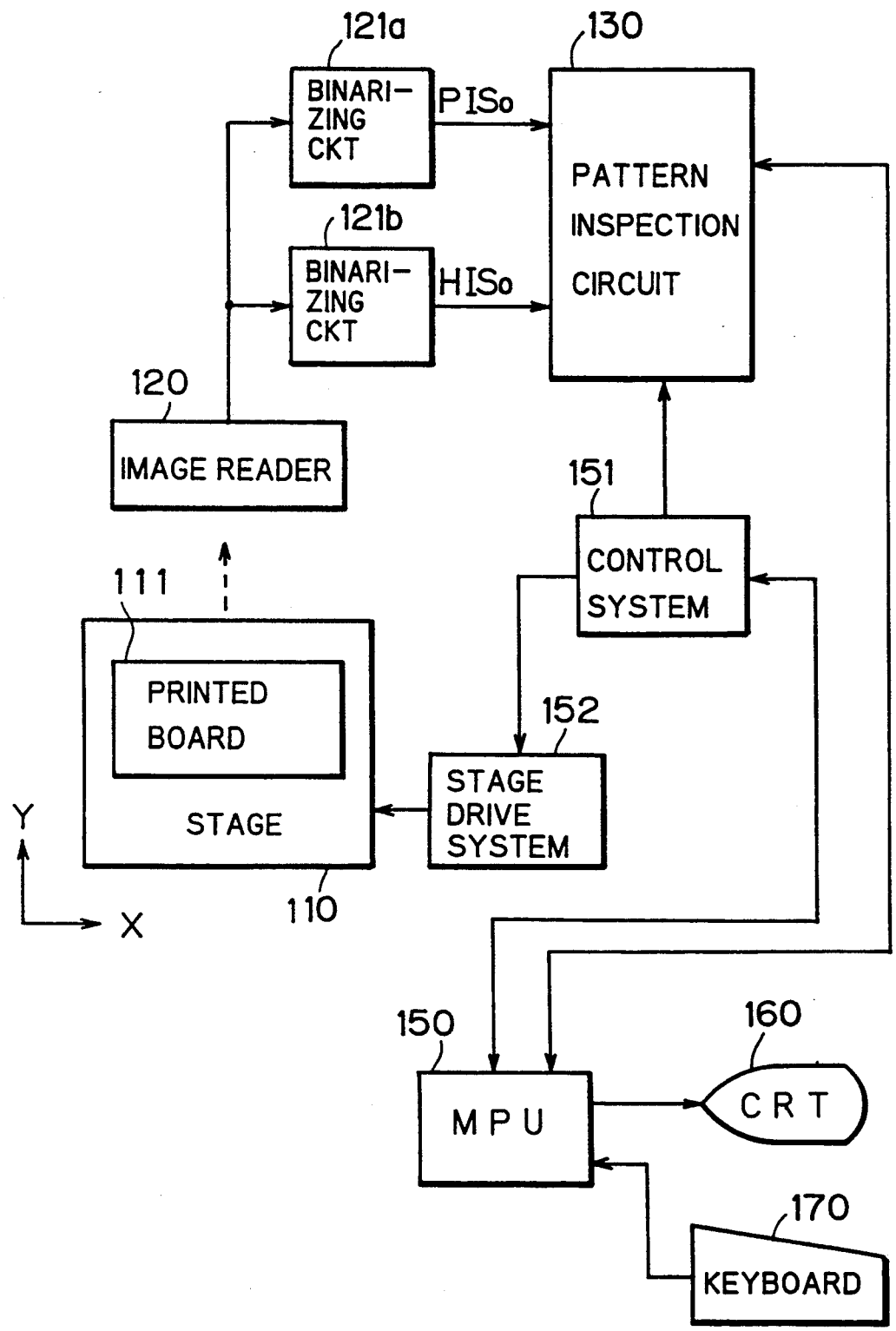
FIG. 24 is a block diagram showing the structure of a printed board inspection apparatus according to the second preferred embodiment of the present invention.

FIG. 24 is a block diagram showing the overall structure of a pattern inspection apparatus according to the second preferred embodiment of the present invention.

A printed board 111 to be inspected is placed on a stage 110. The printed board 111 is fed in a carriage direction Y while the image of the printed board 111 is read with an image reader 120 for each scanning line defined in the direction X. The image reader 120 has a plurality of CCD linear image sensors each having thousands of elements in the line direction X, and is operable to read the pattern of the printed board 111 for each pixel. The image data obtained in the image reader 120 are fed to binarizing circuits 121a and 121b. The binarizing circuit 121b generates a hole image original signal $HIS_0$ while the binarizing circuit 121a generates a pattern image original signal $PIS_0$. Both of the signals $HIS_0$ and $PIS_0$ are inputted in a pattern inspection circuit 130.

The pattern inspection circuit 130 inspects the wiring pattern including lands, and relative positional relation between the same and through holes. The result of the inspection is delivered to a central processing unit (MPU) 150.

The MPU 150 controls the entire apparatus through a control system 151. The control system 151 generates X-Y addresses for specifying addresses of the image data obtained in the pattern inspection circuit 130 etc. It also supplies the X-Y addresses to a stage driving system 152, to control a carrying mechanism for the stage 110.

A CRT 160 receives a command from the MPU 150 and displays various results of operation such as a hole image. A keyboard 170 is used for inputting various instructions to the MPU 150.

H. Optical System and Binalization of Images

Figure 23:
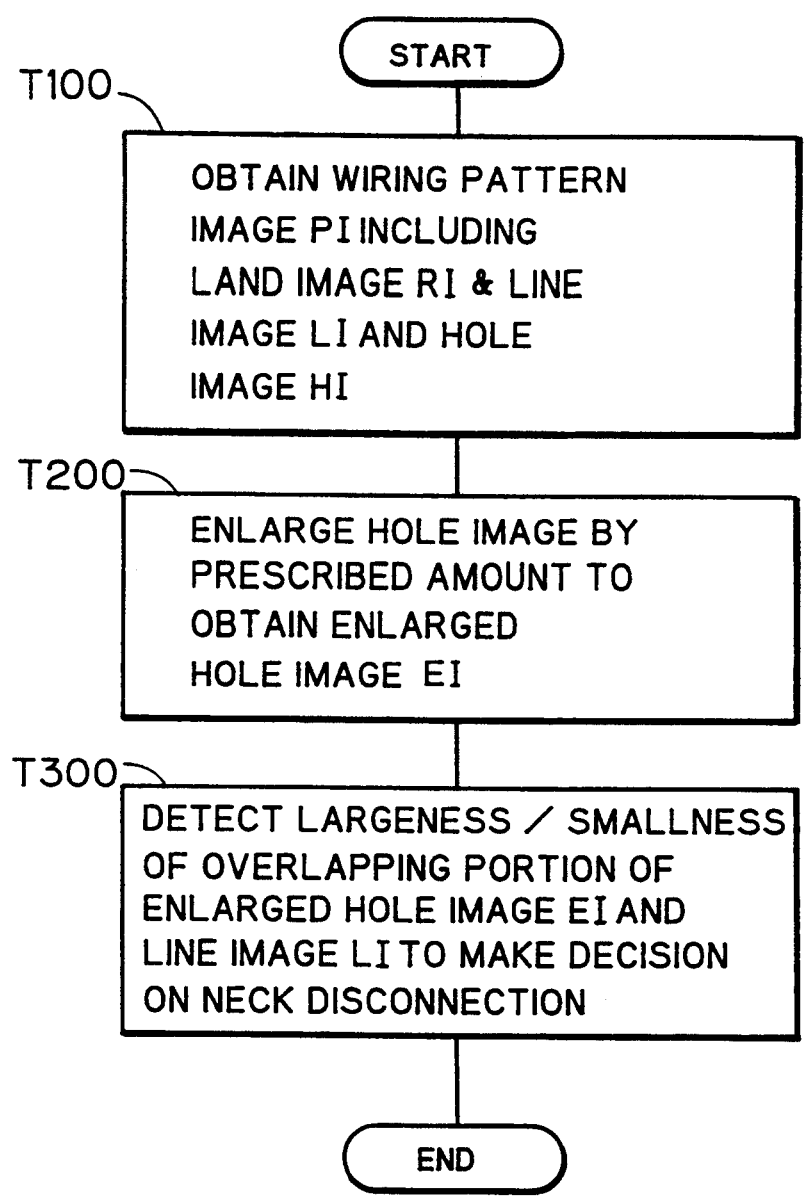
FIG. 23 is a flow chart showing the outline of a second preferred embodiment of the present invention.

Details of the step T100 of FIG. 23 will be now described.

Figure 25:
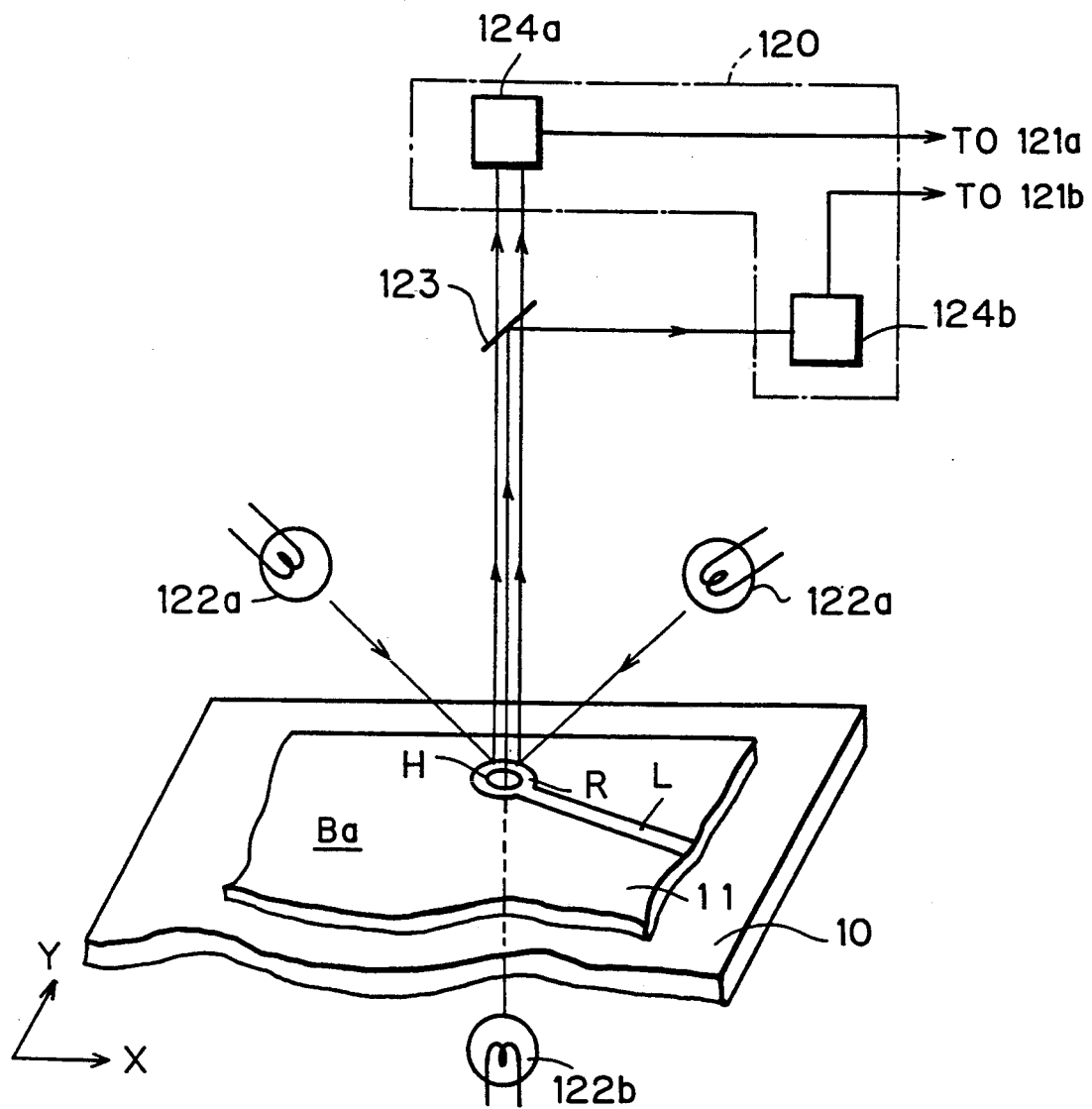
FIG. 25 is a diagram showing the outline of optical reading of a printed board.

FIG. 25 illustrates an example of optical reading systems according to the second preferred embodiment. The optical reading system comprises the stage 110 and the image reader 120.

Light from first light sources 122a is applied to the top major surface of the printed board 111. The printed board 111 comprises a base plate Ba, on which a wiring pattern including a wiring line L and a land R are formed. A through hole H is formed in the land R. The light from the first light sources 122a has a wavelength penetrating a dichroic mirror 123. Thus, the light reflected from the printed board 111 passes through the dichroic mirror 123 and then enters a first array of CCDs 124a, which converts the respective images of the base Ba, the line L and the land R into electric signals for each scanning line.

Figure 27:
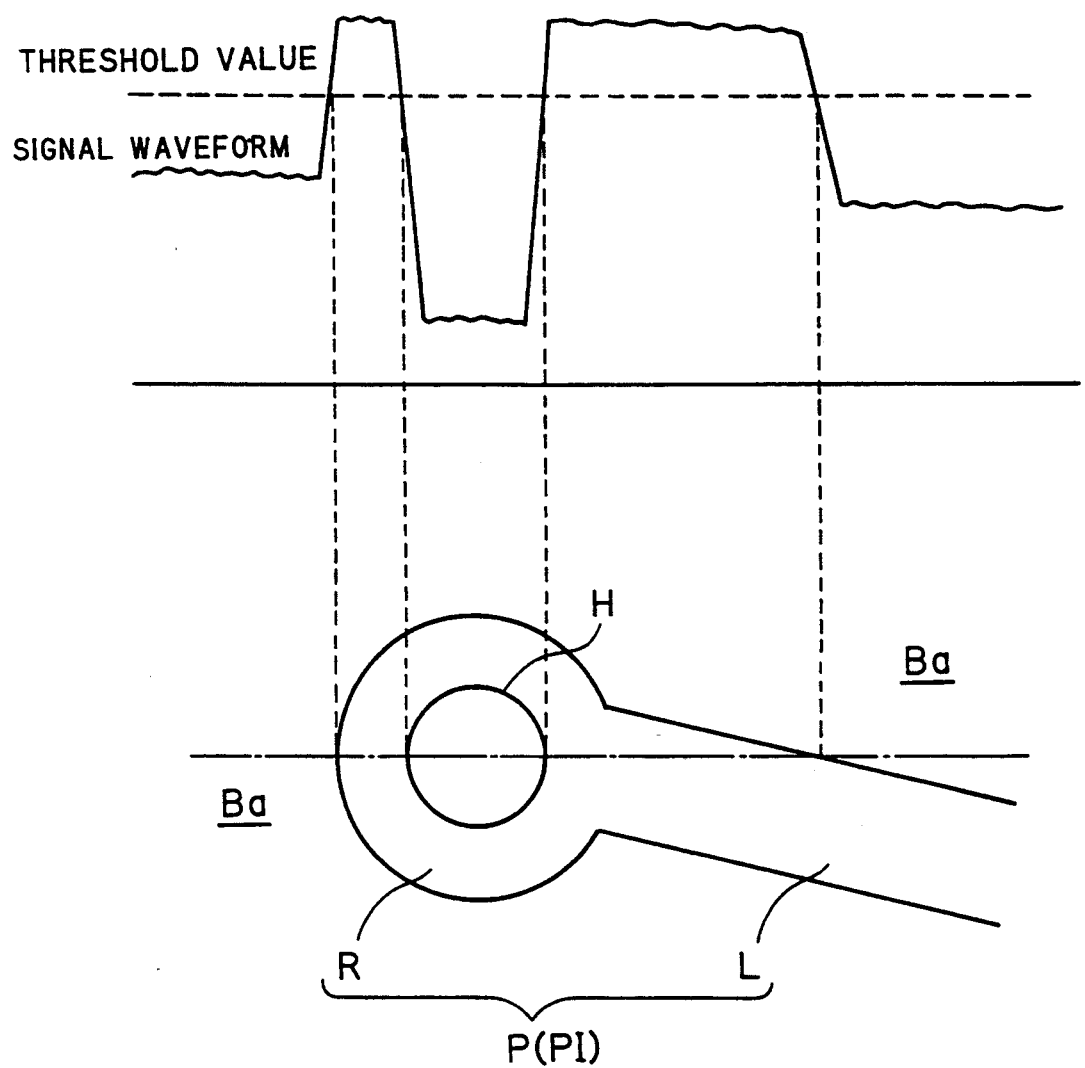
FIG. 27 is a diagram showing relation between a printed board and a signal waveform obtained after optically reading the same.

FIG. 27 illustrates a graph showing a signal waveform obtained in the CCD array 124a and an exemplary pattern obtained by synthesizing respective signal waveforms for two-dimensional area on the printed board 111.

As shown in the signal waveform of FIG. 27, the intensity of the reflected light is relatively weak in the base plate Ba, and the signal level thereof is relatively low. Because the wiring pattern P (the line L and the land R) is made of a metal such as copper, the intensity of the reflected light is large on the wiring pattern, and the signal level thereof is relatively high. In the through hole H, substantially no light is reflected and a signal whose level is below the threshold value TH1 is obtained.

Therefore, it is possible to create a pattern image PI, which is a binarized image of the pattern P, by binarizing a signal from the first CCD array 124a in the binarizing circuit 121a shown in FIG. 24 with a threshold value. The pattern image PI is separated into a line image LI and a land image RI by processing which is described later.

Referring again to FIG. 25, a second light source 122b is provided on the rear side of the stage 110, to emit light whose wavelength is selected to be reflected by the dichroic mirror 123. The light passing through the through hole H is reflected by the dichroic mirror 123, to be applied onto a second CCD array 124b. To this end, the stage 110 is made of a transparent material. The signal goes to the highest level at the through hole H, to an intermediate level at the wiring pattern P (the line L and the land R) and to a relatively low level at the base Ba. Therefore, it is possible to create a hole image HI, which is a binarized image of the hole H, by binarizing the signal in the binarizing circuit 121b shown in FIG. 24 with a threshold value, similarly to the pattern image PI.

Figure 26:
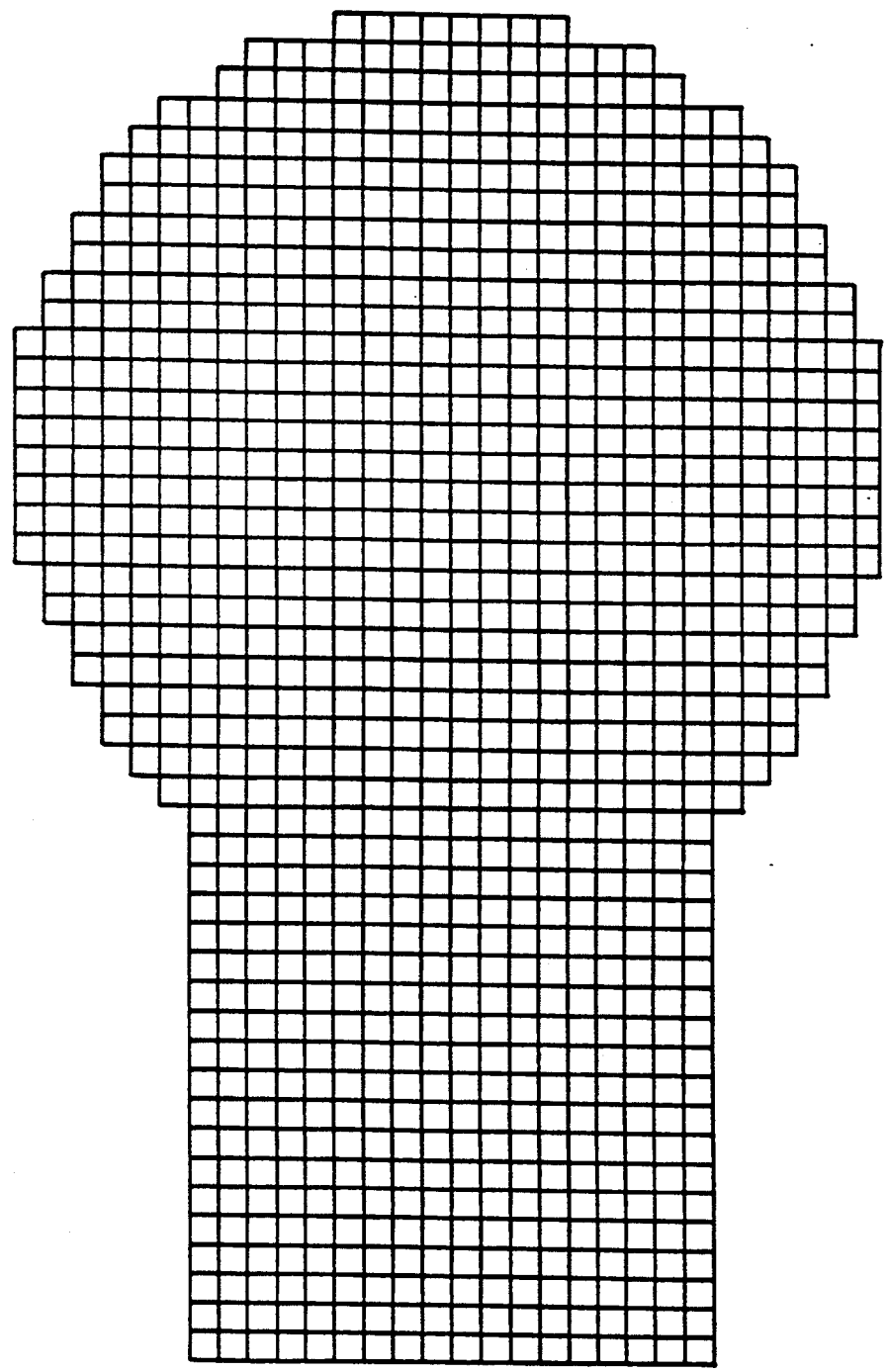
FIG. 26 is a diagram showing a pattern image PI.

FIG. 26 shows an example of the pattern image PI obtained in the aforementioned manner. Because the reflected light is read in every pixel, the pattern image PI consists of a matrix array of square pixels.

I. Pattern Inspection Circuit

Figure 28:
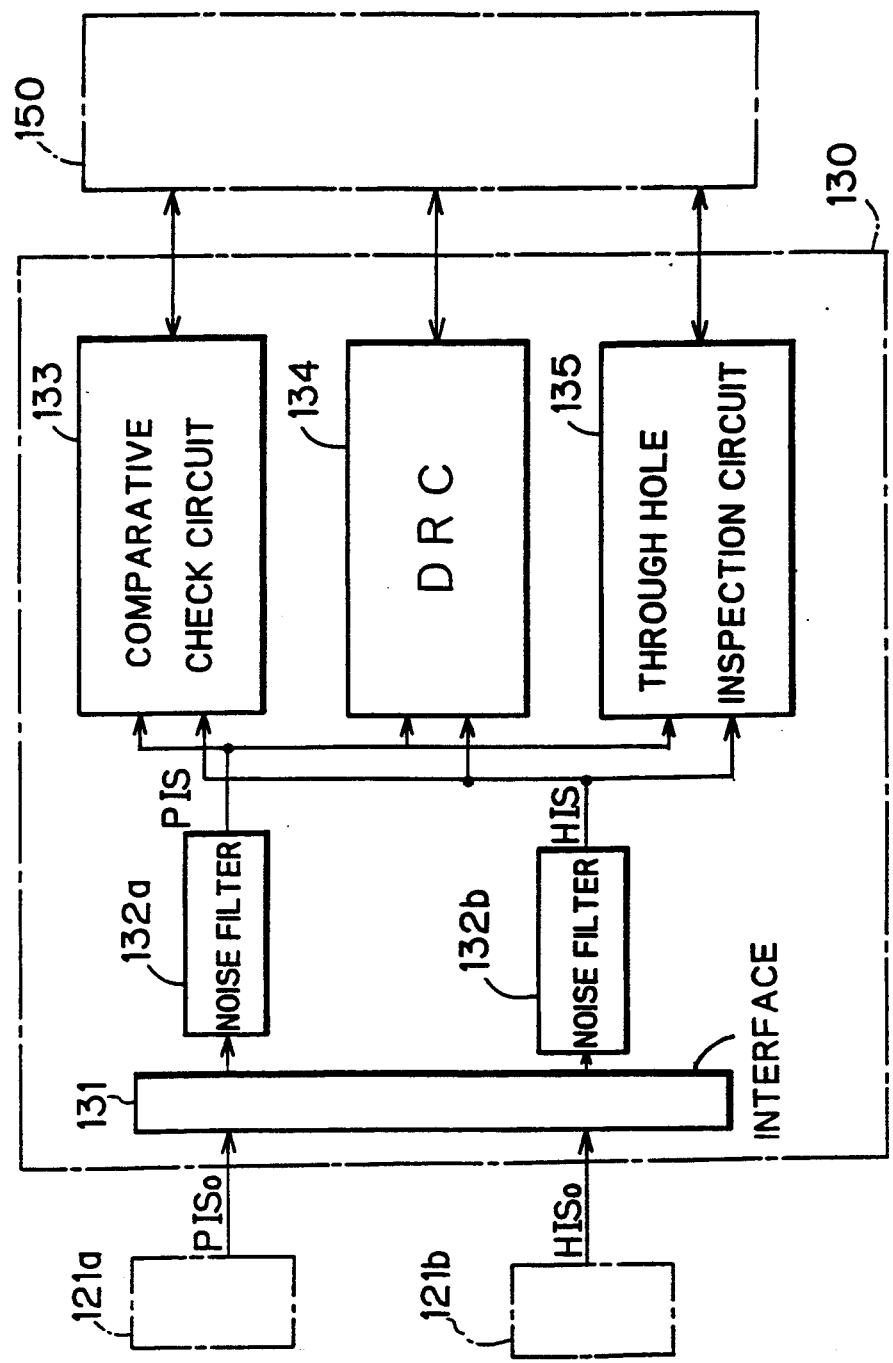
FIG. 28 is a block diagram showing the structure of a pattern inspection circuit 130.

FIG. 28 is a block diagram showing the internal structure of the pattern inspection circuit 130 shown in FIG. 24.

A pattern image original signal $PIS_0$ and a hole image original signal $HIS_0$ created in the binarizing circuits 121a and 121b of FIG. 24 are supplied to noise filters 132a and 132b through an interface 131, respectively. The noise filters 132a and 132b eliminate noises by performing smoothing processing or the like, and create a pattern image signal PIS and a hole image signal HIS, respectively.

Both of the hole image signal HIS and the pattern image signal PIS are supplied to a comparative check circuit 133, a DRC (design rule check) circuit 134 and a through hole inspection circuit 135.

The comparative check circuit 133 is adapted to compare the hole image signal HIS and the pattern image signal PIS with image signals obtained with respect to a previously prepared reference printed board, thereby identifying portions where the signals are different from each other as defects. The reference printed board is prepared from a printed board, which is of the same type as the printed board 111 to be inspected, and has previously been determined to be nondefective.

The through hole inspection circuit 135 is adapted to extract characters of the land R and the line L such as width thereof, a pattern angle and continuity of respective images and decide whether these characters deviate from corresponding design values, thereby detecting defectiveness of the printed board 111. The inspection method of measuring an angular aperture, which has been illustrated in the item of the prior art, is carried out in this circuit.

J. Through Hole Circuit

(J-1). Outline

Before explaining structures and operations of respective parts of the through hole inspection circuit 135 in detail, the outline thereof is now described.

Figure 29:
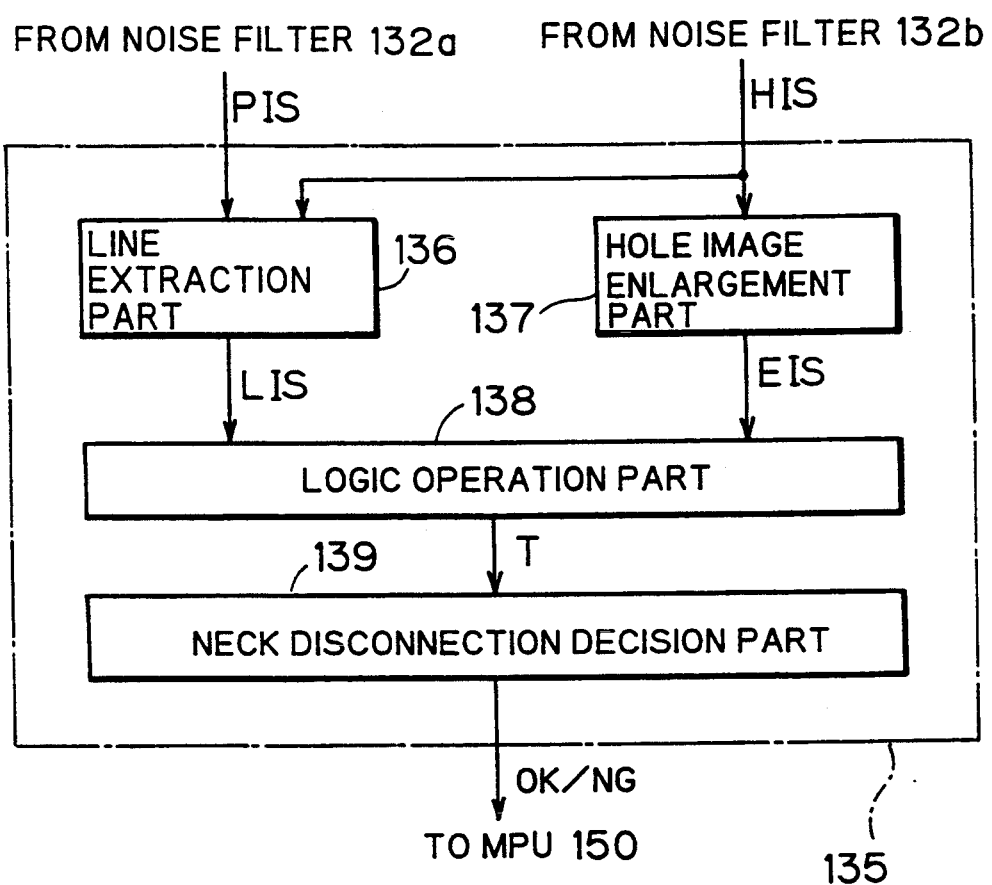
FIG. 29 is a block diagram showing the structure of a through hole inspection circuit 135.

FIG. 29 is a block diagram showing the outline of the through hole inspection circuit 135. A line extraction part 136 receives the pattern image signal PIS from the noise filter 132a shown in FIG. 28 and obtains a line image LI from the pattern image PI. The line images LI is represented in the form of a line image signal LIS, which is transmitted to a logic operation part 138. The extraction of the line image LI is conducted on an image which is obtained by filling a blank area in the binary pattern image PI with the hole image HI, to thereby attain high accuracy in the extraction of the line image LI.

On the other hand, a hole image enlargement part 137 receives the hole image signal HIS from the noise filter 132b shown in FIG. 28 and obtains an enlarged hole image EI by a enlarging the hole image HI by prescribed width. An enlarged hole image signal EIS, which is a binary signal representing the enlarged hole image EI, is transmitted to the logic operation part 138. Namely, the line extraction part 136 performs the procedure of the step T100 shown in FIG. 23 with the reader 120 etc., while the hole image enlargement part 137 performs the procedure of the step T200 shown in FIG. 23.

The logic operation part 138 shown in FIG. 29 is adapted to obtain an overlapping portion T of the line image signal LIS and the enlarged hole image signal EIS from these signals. A neck disconnection decision part 139 makes a decision as to whether neck disconnection has occurred on the basis of the overlapping portion T, to transmit a signal OK or NG indicating that the wiring pattern is nondefective or defective to the MPU 150. This procedure corresponds to the step T300 of FIG. 23.

(J-2). Detection of Line Image

Figure 30:
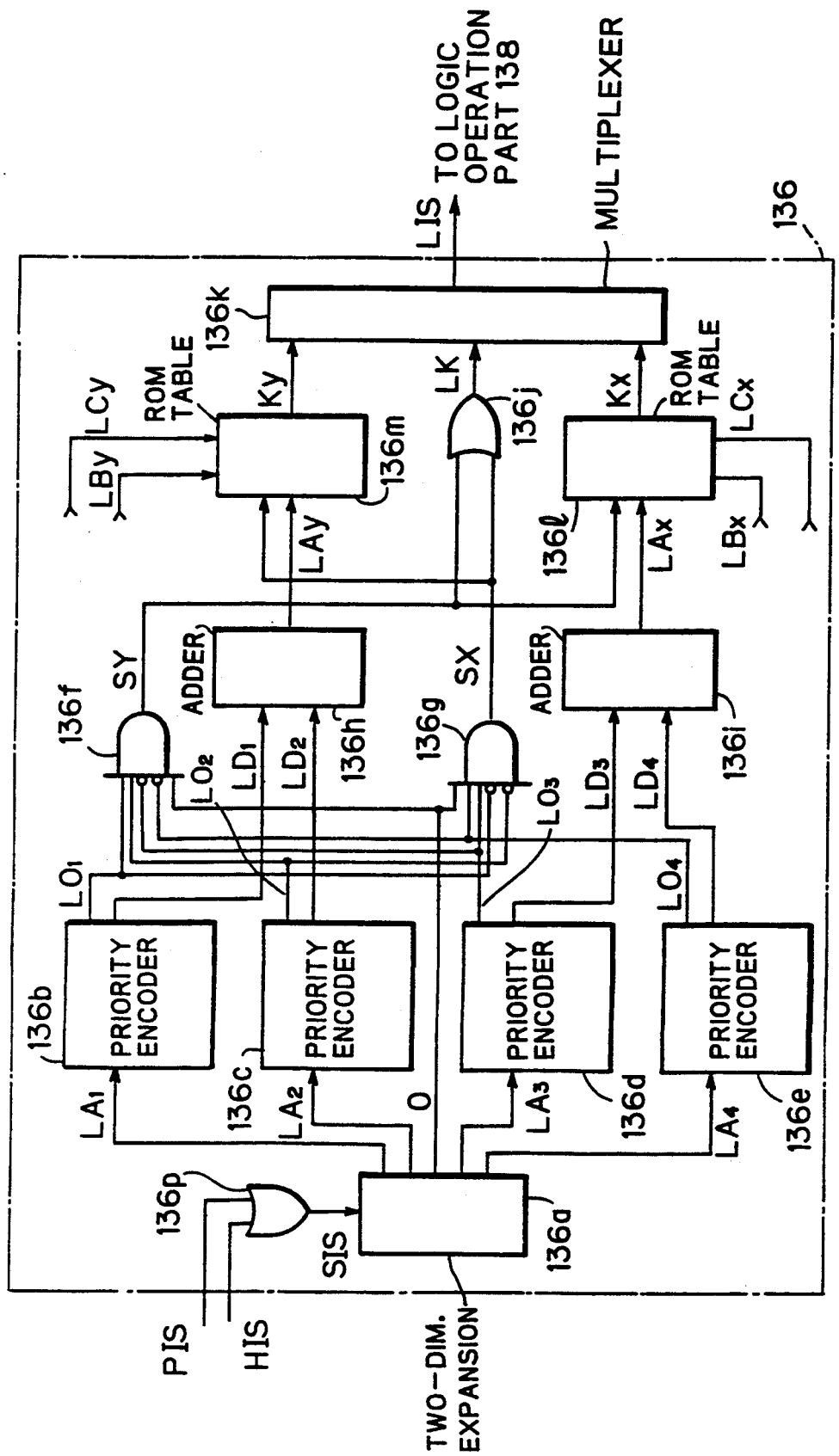
FIG. 30 is a block diagram showing the structure of a line extraction part 136.
Figure 31:
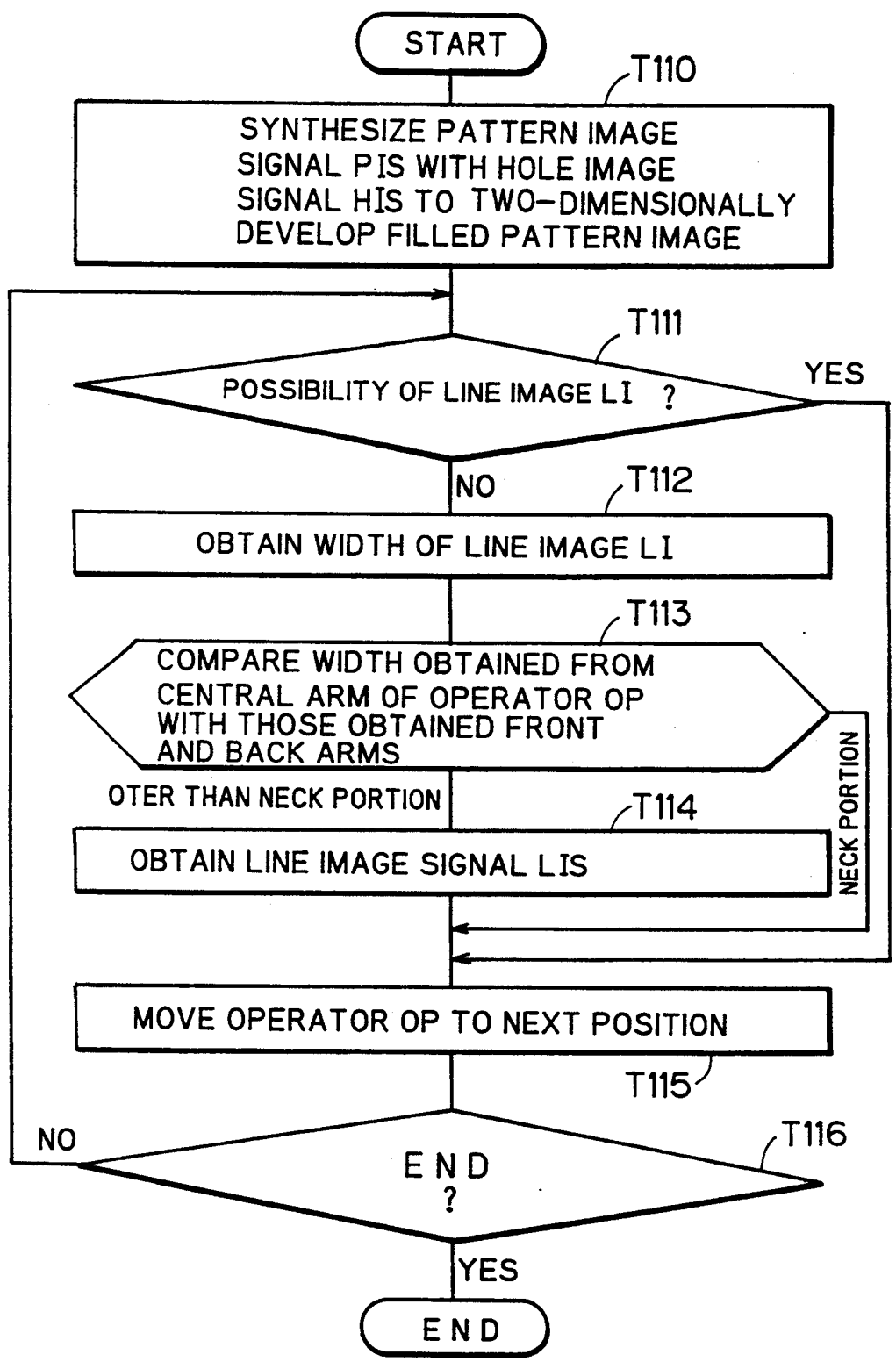
FIG. 31 is a flow chart showing the operation of the line extraction part 136.

FIG. 30 shows the outline of the line extraction part 136, and FIG. 31 is a flow chart showing flow of the operation of the line extraction part 136. As already described, the flow chart of FIG. 31 forms a part of the step T100 of FIG. 23.

Figure 32:
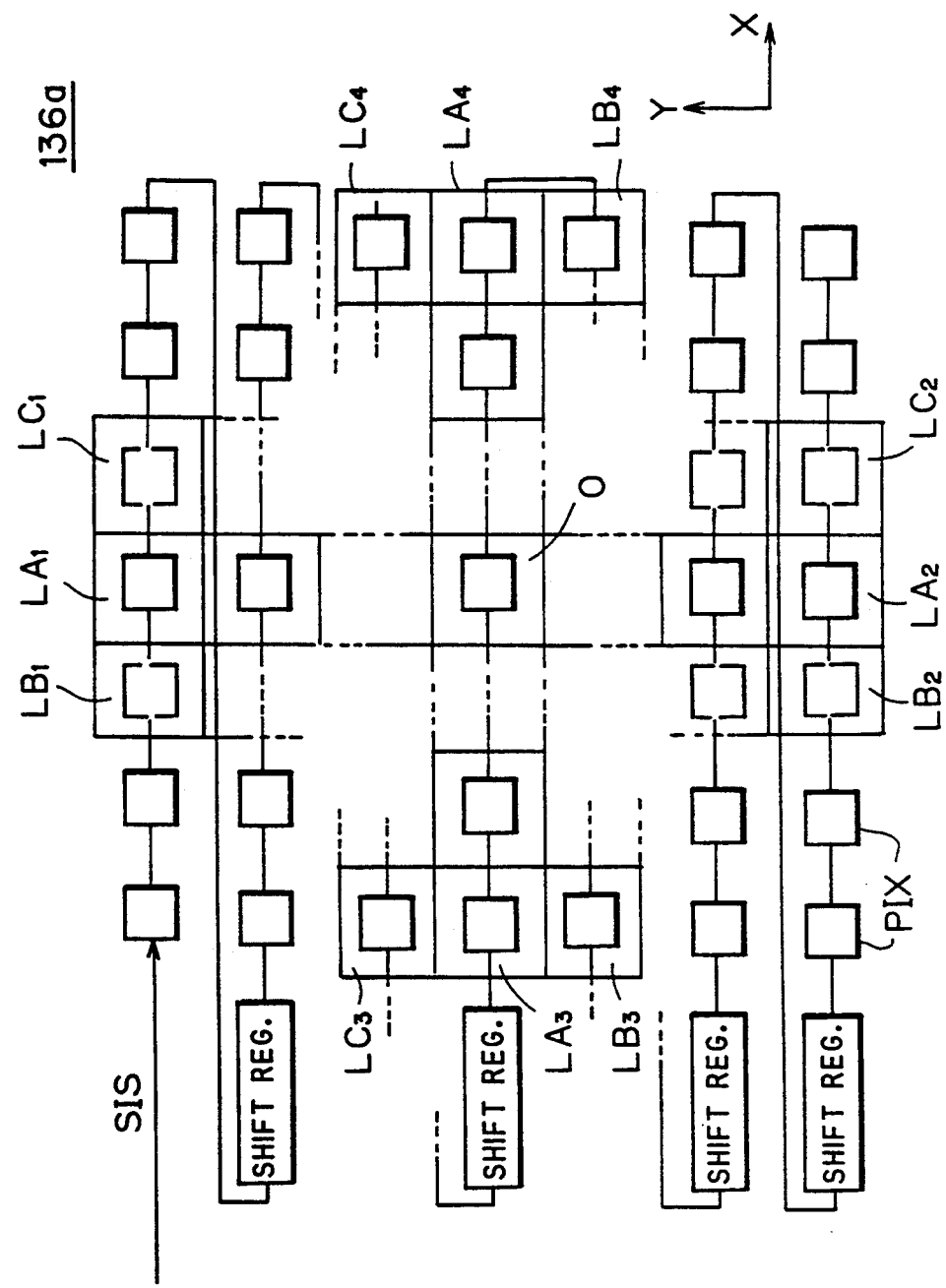

An OR gate 136p synthesizes the pattern image signal PIS with the hole image signal HIS to obtain a synthesized pattern image signal SIS, thereby filling up the pattern image PI, which corresponds to the wiring pattern P which is missing because of the hole H. A two-dimensional expansion part 136a, which corresponds to the step T110 in FIG. 31, is adapted to expand the synthesized pattern image SIS into a two-dimensional array of image levels to generate a synthesized pattern image SI. As shown in FIG. 32, this circuit is formed by a set of shift registers. Pixels PIX may be individual pixels in the synthesized pattern signal SIS, or alternately, each pixel PIX may be a cluster of some pixels. In the latter case, a binary image level "1" or "0" on each pixel PIX is obtained through a majority decision among respective pixels in the cluster. It is assumed here that a signal showing presence of the wiring pattern P is "1" and a signal showing the base Ba is "0".

At the step T111, the operator OP is applied to the pixels PIX which are two-dimensionally expanded in the set of shift registers, to detect presence/absence of the line image LI.

Figure 33:
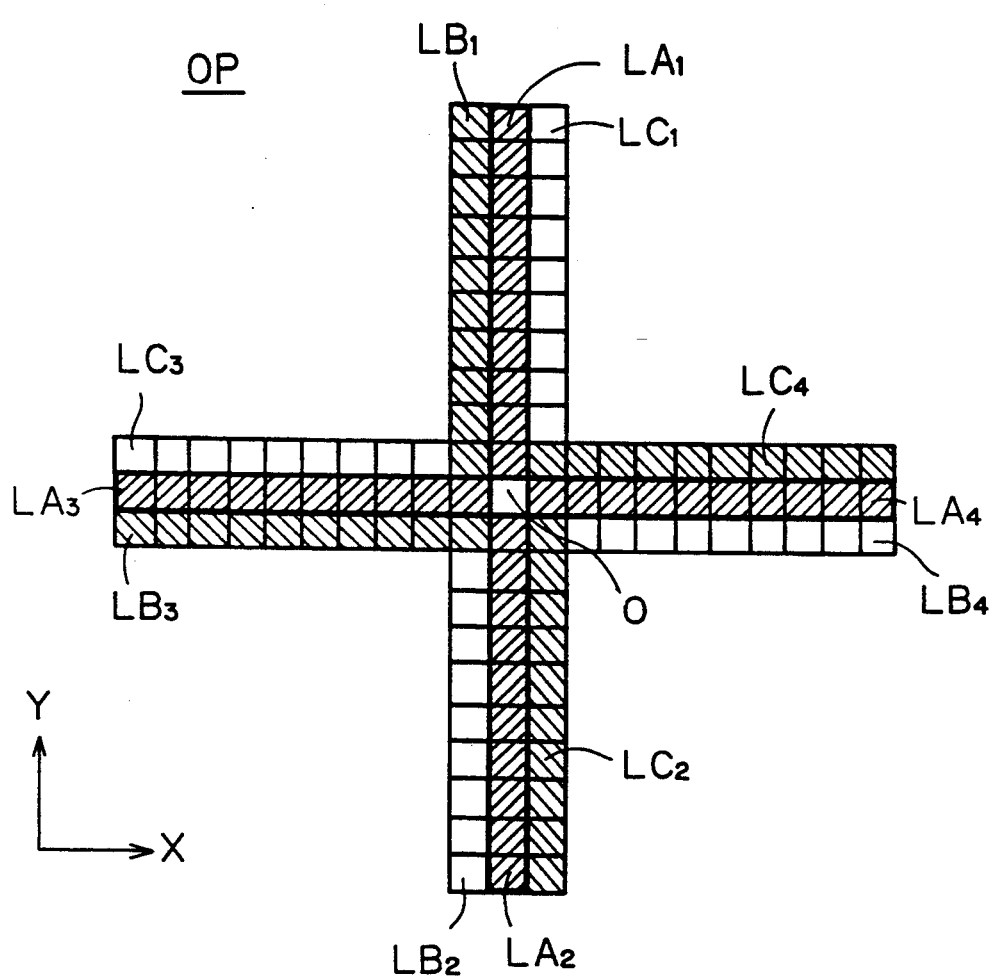
FIG. 33 is an explanation diagram for an operator OP having arms each comprising a plurality of pixel chains.

FIG. 33 illustrates the configuration of the operator OP. The operator OP has four arms extending in the direction X or Y from the center pixel O. The first arm extending upward is comprised of a bundle of three pixel chains $LA_1$, $LB_1$ and $LC_1$. Similarly, the second arm extending downward is composed of a bundle of three pixel chains $LA_2$, $LB_2$ and $LC_2$, while the third and fourth arms extending along the horizontal direction X are comprised of respective bundles of pixel chains ($LA_3$, $LB_3$, $LC_3$) and ($LA_4$, $LB_4$, $LC_4$), respectively. Respective pixel chains will be also referred to as "unit arms."

Figure 34:
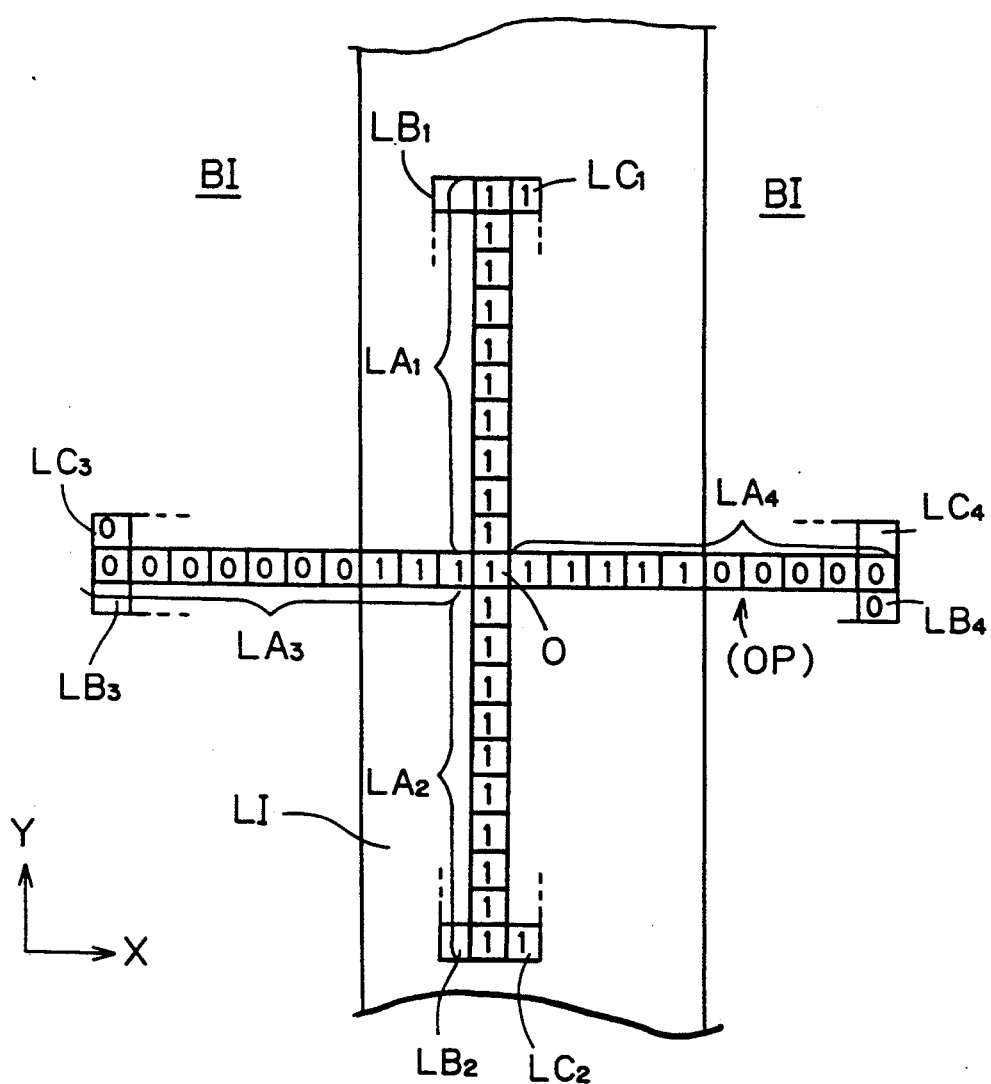
FIG. 34 is an explanatory diagram for a state of recognizing a line image LI.

FIG. 34 shows such a case that the operator OP is applied to a line image LI running in the Y direction. This figure also shows only the central arms $LA_1$, $LA_2$, $LA_3$ and $L_4$ of the operator OP, for the purpose of simplification.

The center 0 of the operator OP is now on a pixel PIX, which has a value of "1". If the pixel corresponding to the center O is "0", the center 0 is not on the pattern P but on the base Ba, and hence the process is advanced from the step T111 to the step T115. The two-dimensional expansion part 136a outputs O=0 to AND gates 136f and 136g shown in FIG. 30, and a line candidate signal LK, which is an output of an OR gate 136j, is made "0" under the condition that that $SX=SY=0$.

Referring again to FIG. 34, when the pixel PIX corresponding to the center O is "1", i.e., when O=1, respective lengths $LD_1$ to $LD_4$ of the central unit arms $LA_1$ to $LA_4$ of the operator OP are obtained. The value "1" of the pixels PIX is counted by priority encoders 136b to 136e from the center O. In the case of FIG. 34, obtained is:

$$LD_1=10, LD_2=10, LD_3=3, LD_4=5 \tag{1}$$

where the value "1" on the center pixel O is not included.

Then, a decision is made as to whether the center 0 is on the line image LI on the basis of the values $LD_1$ to $LD_4$. If a unit arm $LA_i$ is "1" in all bits it is decided that the i-th arm is fully on the line image and a signal $LO_i$ is provided with a value of "1," where the number i is 1, 2, 3 or 4. In the case of FIG. 34, the unit arms $LA_1$ and $LA_2$ are "1" in all bits while the unit arms $LA_3$ and $LA_4$ include "0", whereby obtained is:

$$LO_1=1, LO_2=1, LO_3=0, LO_4=0 \tag{2}$$

The signals $LO_i$ are also created in the priority encoders 136b to 136e.

In order to correctly detect the line image LI on an end of the line image LI, i.e., in the vicinity of the neck, it is necessary to obtain the signals $LO_i$ even if the center O of the operator OP is in the vicinity of the neck and hence an arm extending in the running direction of the line L is present on the land image RI. However, the land R has a window corresponding to the hole H, and hence the land image RI has a window. Therefore, the synthesized pattern SI is obtained by the OR gate 136p to compensate the window by the hole image HI, so that it is possible to correctly detect the line image also in the vicinity of the neck.

If the equation (2) holds, there is a possibility that the wiring pattern P runs in the Y direction in the vicinity of the center O. In other words, it is decided that the pattern image PI may be the line image LI under the condition (2), and the process is advanced to the step T112 to obtain the width of the line image LI from the arm lengths $LD_3$ and $LD_4$ in the expression (1).

An output of an AND gate 136f becomes "1" so that a line direction signal SY=1 is transmitted to an OR gate 136j and a ROM table 136l.

Also when the line L runs in the X direction, an output of an AND gate 136g becomes "1" so that a line direction signal SX=1 is transmitted to the OR gate 136j and a ROM table 136m.

When the center O is decided to be on the line image LI running in the X or Y direction as described above, the OR gate 136j makes the line candidate signal LK "1".

If the operator OP acts on the land image RI, all bits of the unit arms $LA_1$ to $LA_4$ and the center O may become "1", so that the following equation (3) may hold:

$$LO_1=LO_2=LO_3=LO_4=1 \tag{3}$$

In this case, the outputs of the AND gates 136f and 136g become "0" and the line direction signals become SX=SY=0, whereby the output of the OR gate 136j becomes "0" and the line candidate signal LK becomes "0", so that no decision is made on the line image LI. As understood from this situation, it is preferable to set the respective full lengths of the unit arms $LA_1$ to $LA_4$ to be longer than an expected maximum width of the line L and smaller than the size of the land R.

Then, the width of the line image LI is obtained at the step T112.

When the equation (2) holds and there is such a possibility that the line image LI runs in the Y direction, its width $LA_x$ is obtained in an adder 136i as:

$$LA_x=LD_3+LD_4+1 \tag{4}$$

where the number "1" in the right hand side corresponds to the center pixel O.

Then, the width of the line image LI is obtained also with the unit arms $LB_1$–$LB_4$ and $LC_1$–$LC_4$ of the operator OP similarly to the width $LA_x$, in order to reduce a blind zone in the wiring image on which the operator OP cannot detect the line image.

Widths $LC_x$ and $LB_x$ are obtained with the unit arms ($LC_3$, $LC_4$) and ($LB_3$, $LB_4$) which are on positive and negative sides of the Y direction across the central unit arms $LA_3$ and $LA_4$, respectively. Circuits for obtaining these widths $LB_x$ and $LC_x$, which are omitted in FIG. 30 for the purpose of simplification may consist of priority encoders and adders, similar to the means for obtaining the width $LA_x$.

Also, when the line image LI may run in the X direction, a width $LA_y$ measured with the central unit arms $LA_1$ and $LA_y$ is obtained in an adder 136h. Further, widths $LC_y$ and $LB_2$ are obtained from the unit arms ($LC_1$, $LC_2$) and ($LB_1$, $LB_2$) provided on positive and negative sides of the X direction across the unit arms $LA_1$ and $LA_2$, respectively.

The widths $LA_x$, $LB_x$ and $LC_x$ of the line image LI are transmitted to the ROM table 136l with the line direction signal SY, while the widths $LA_y$, $LB_y$ and $LC_y$ are transmitted to the ROM table 136m with the line direction signal SX, respectively.

The ROM table 136l decides that the center O of the operator OP is not on a neck portion when the widths $LA_x$, $LB_x$ and $LC_x$ satisfy a prescribed relation among them and the process is advanced to the step T114. The "prescribed relation" is such a condition that these widths are substantially equal to each other, i.e.:

$$|LA_x-LB_x|\leq\epsilon, |LB_x-LC_x|\leq\epsilon, |LC_x-LA_x|\leq\epsilon \tag{5}$$

where symbol $\epsilon$ represents a prescribed error allowance value, which is set at a non-negative value. The following description is directed to such a case that the operator shown in FIG. 33 is applied to the synthesized image SI shown in FIG. 26.

Figure 35:
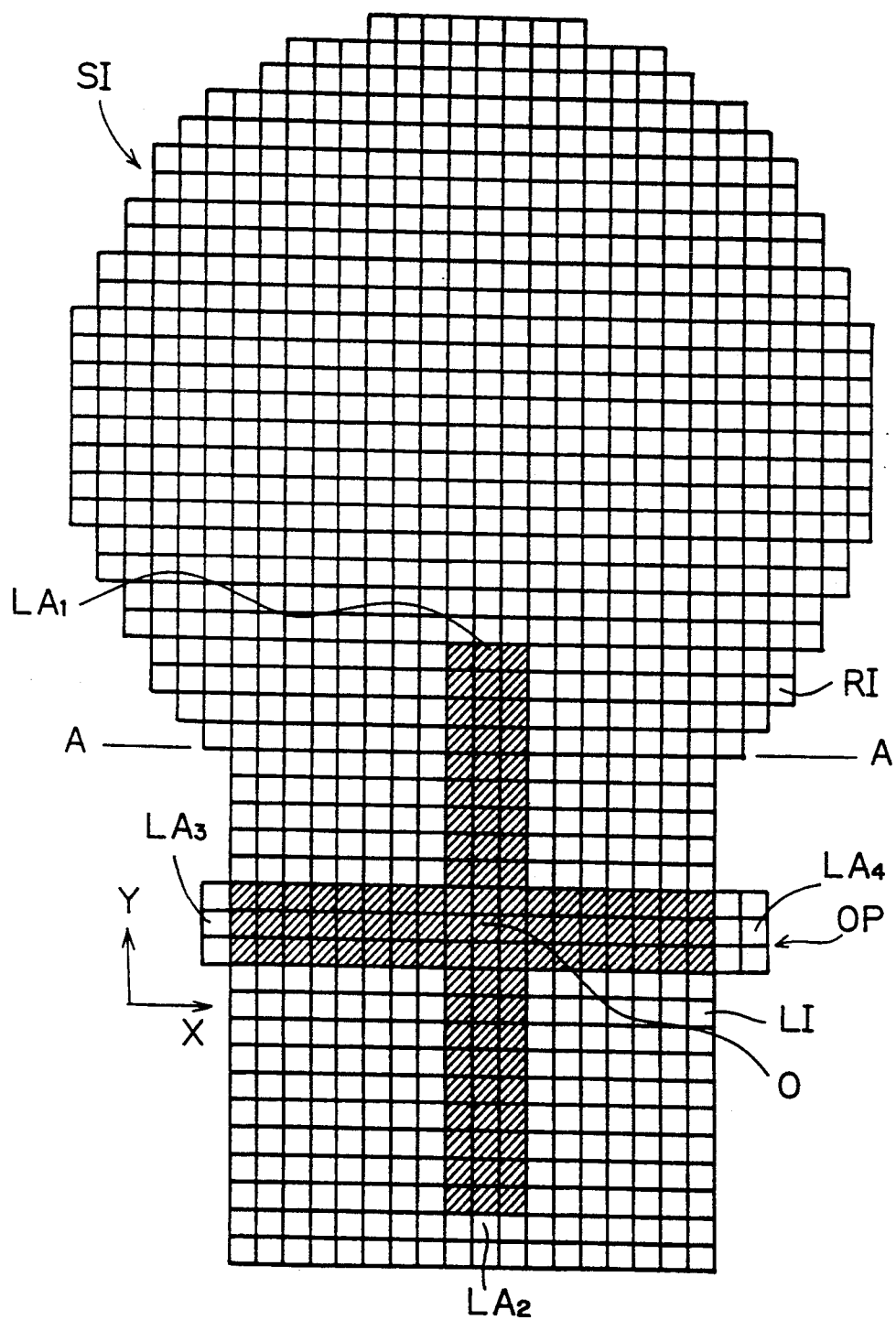
FIGS. 35 through 37 are explanatory diagrams for the second preferred embodiments of the present invention.

FIG. 35 shows such a case that the center pixel O is on the line image LI. Pixels of the operator OP which are present on the synthesized image SI are shown with hatches. A line AA shows extension of a neck line K, and it is assumed that the operator OP relatively progresses in the Y direction. Among the unit arms of the operator OP extending in the Y direction, the whole of the central unit arms $LA_1$ and $LA_2$ are on the synthesized image SI. On the other hand, the central unit arms $LA_3$ and $LA_4$ extending in the X direction have portions which are not on the synthesized image SI. Thus, it is decided that the line image LI may run in the Y direction, and widths $LA_x$, $LB_x$ and $LC_x$ are obtained at the step T113 as:

$$LA_x = LB_x = LC_x = 18 \quad (6)$$

Figure 36:
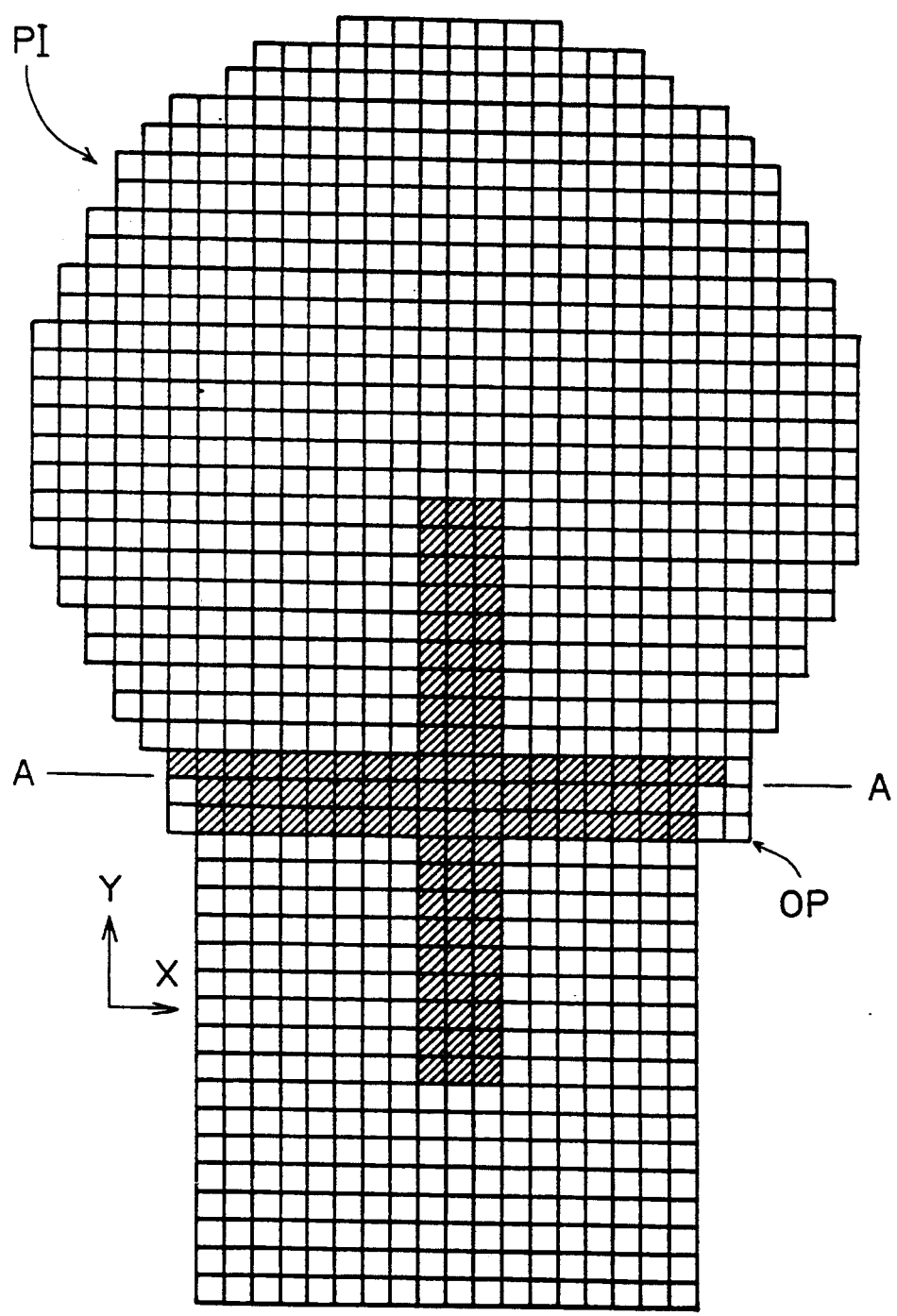

When the center O reaches the neck line K shown by a line AA shown in FIG. 36, on the other hand, obtained is:

$$LA_x = LB_x = 18, LC_x = 20 \quad (7)$$

Figure 37:
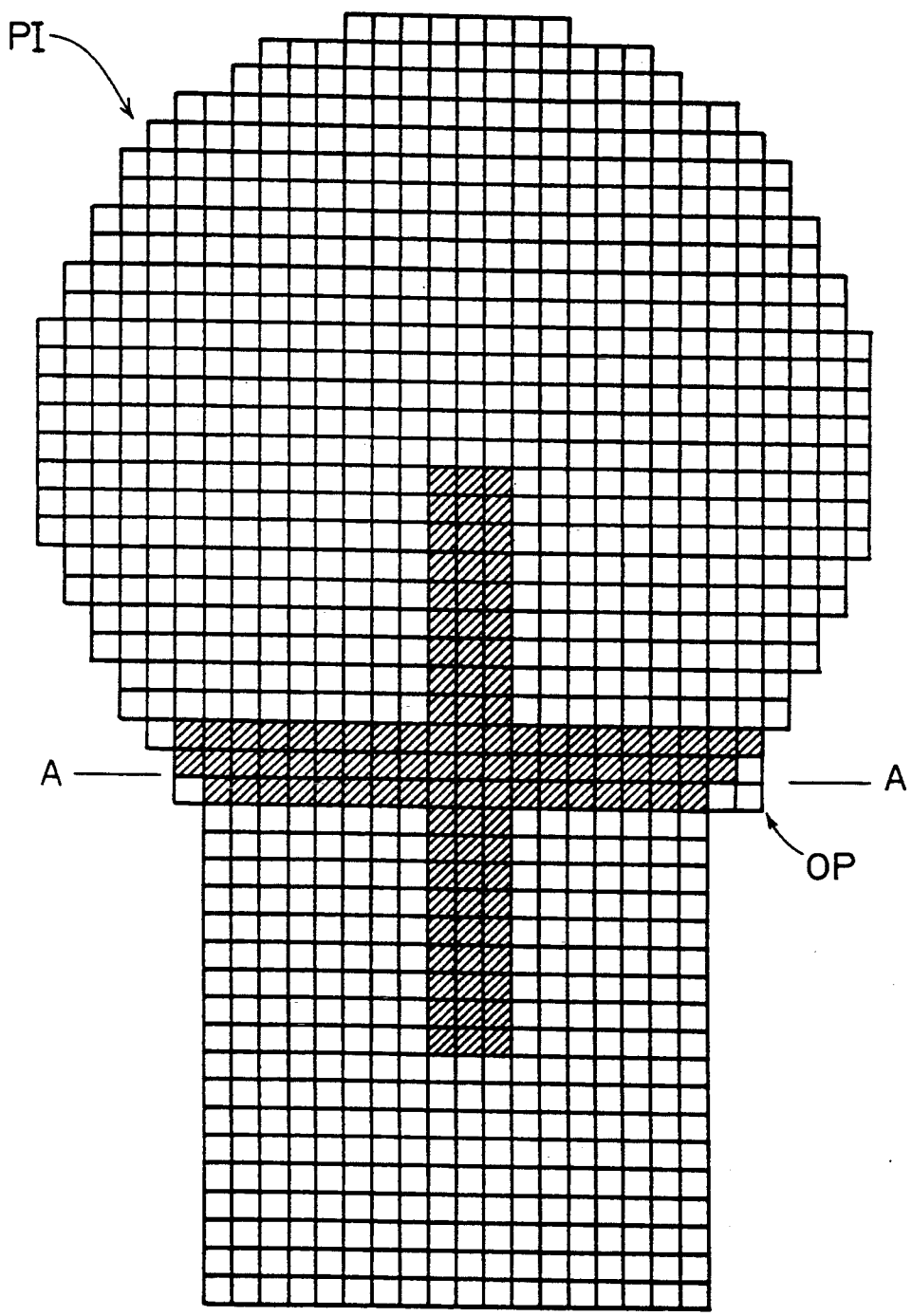

When the center O goes beyond the neck line K as shown in FIG. 37, obtained is:

$$LA_x = 20, LB_x = 18, LC_x = 21 \quad (8)$$

With respect to the synthesized image SI shown in FIGS. 35 to 37, therefore, it is possible to decide whether or not the center O of the operator OP is on the line image LI assuming that e=2 in the expression (5).

The ROM tables 136l and 136m make the decisions whether the condition (5) is satisfied, respectively, to output signals $K_x$ and $K_y$ having a value "0" for a neck portion and a value "1" for an off-neck portion, respectively (the step T113).

Thereafter, a multiplexer 136k outputs the line image signal LIS at the step T114. The multiplexer 136k holds the value of "0" therein and outputs one of the signals $K_x$ and $K_y$ indicative of whether the object image portion is the neck portion when the line candidate signal LK is "1." On the other hand, when the signal LK is "0," the multiplexer 136k makes the line image signal LIS "0.0". The signals $K_x$ and $K_y$ are selected as the line image signal LIS when the line direction signals SX and SY are "1," respectively. It is inhibited that both of the signals SX and SY simultaneously become "1."

Figure 38:
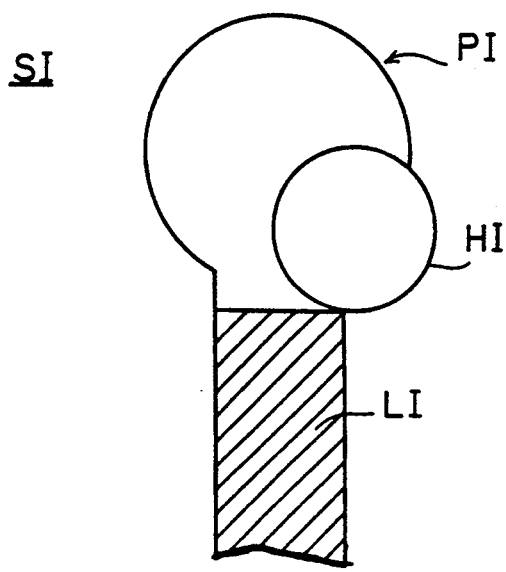
FIG. 38 is an explanatory diagram for retraction of a line image LI.

As shown in FIG. 38, a synthesized pattern SI may become wider than a pattern image PI to which the operator OP is to be applied. Although a line image LI is retracted from an original line L in this case, there is no problem in the present invention. This is explained in the following section.

(J-3). Enlargement of Hole Image

Figure 39:
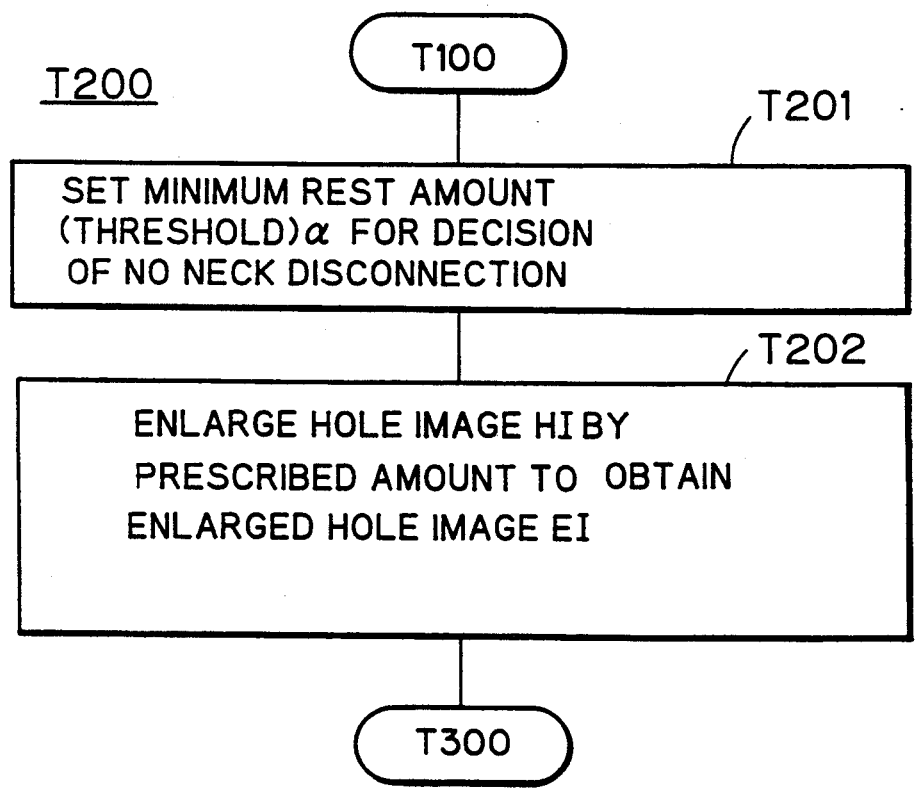
FIG. 39 is a flow chart showing a step T200 in detail.
Figure 40:
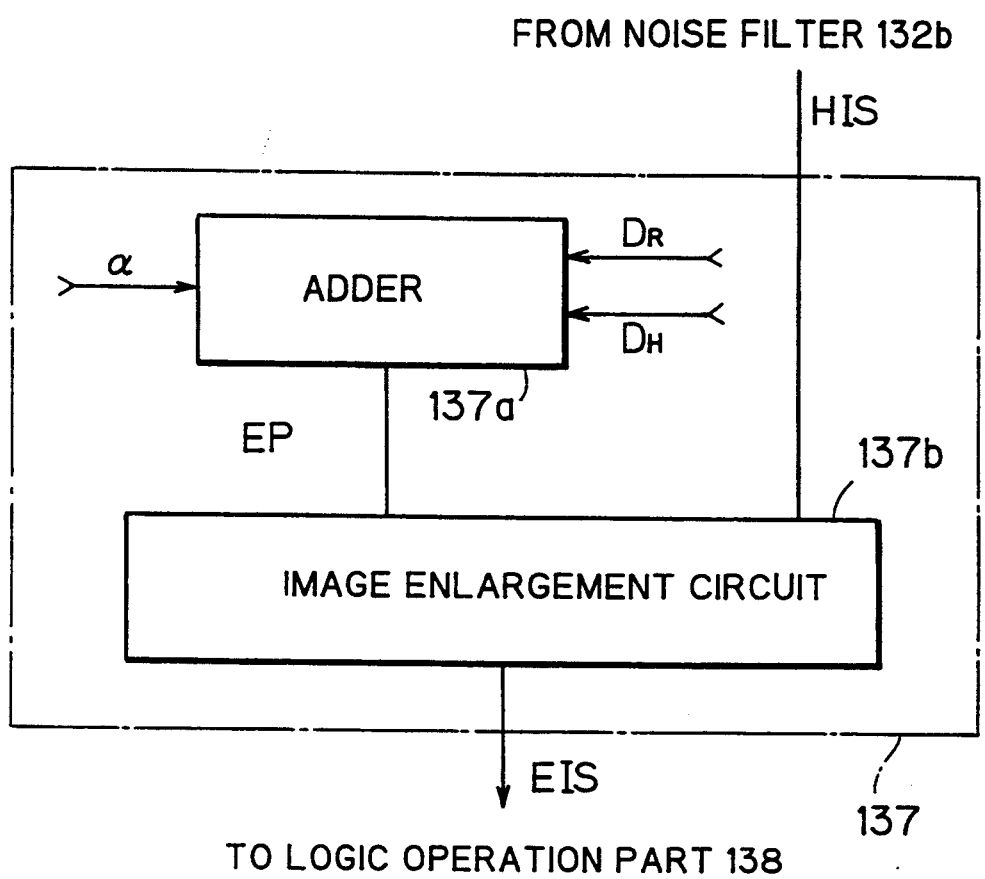
FIG. 40 is a block diagram showing the structure of a hole image enlargement part 137.

FIG. 39 shows the step T200 of FIG. 23 in detail, and FIG. 40 shows the internal structure of the hole image enlargement part 137, respectively.

As already described, a minimum allowable off-neck width (threshold value) to be ensured is previously set in connection with the enlargement of the hole image HI to make a decision of neck disconnection for an off-neck width less than the minimum allowable off-neck width. Therefore, such a threshold value $\alpha$ is set first (the step T201). An adder 137a obtains an amount EP of enlargement from the value of $\alpha$ and land diameter $D_R$ and hole diameter $D_H$ which are previously determined. While the amount EP of enlargement is equal to the threshold value $\alpha$ in most cases, an overlapping portion with the line L may be caused even if the hole H is in a correct position, as understood from FIG. 50. This is because a neck line K is recognized as an end portion of the line L although the land R has a circular configuration and projects over the neck line K. Further, it may also be necessary to compensate a quantization error. The adder 137a is provided so that it is possible to correct the amount EP of enlargement with the values of the threshold value $\alpha$, the diameters $D_H$ and $D_R$ and the like, to re-inspect neck disconnection.

Thereafter, an image enlargement circuit 137b enlarges the hole image EI at the step T202. More particularly, the circuit 137b performs image processing such as 4-linkage enlargement, 8-linkage enlargement or the like on the hole image signal HIS, to obtain an enlarged through hole image signal EIS.

(J-4). Detection of Overlapping Portion and Determination of Neck Disconnection

The logical product T of the line image signal LIS obtained in the line extraction part 136 and the enlarged hole image signal EIS obtained in the hole image enlargement part is taken to make a decision as to neck disconnection on the basis of the logical product T.

Figure 41:
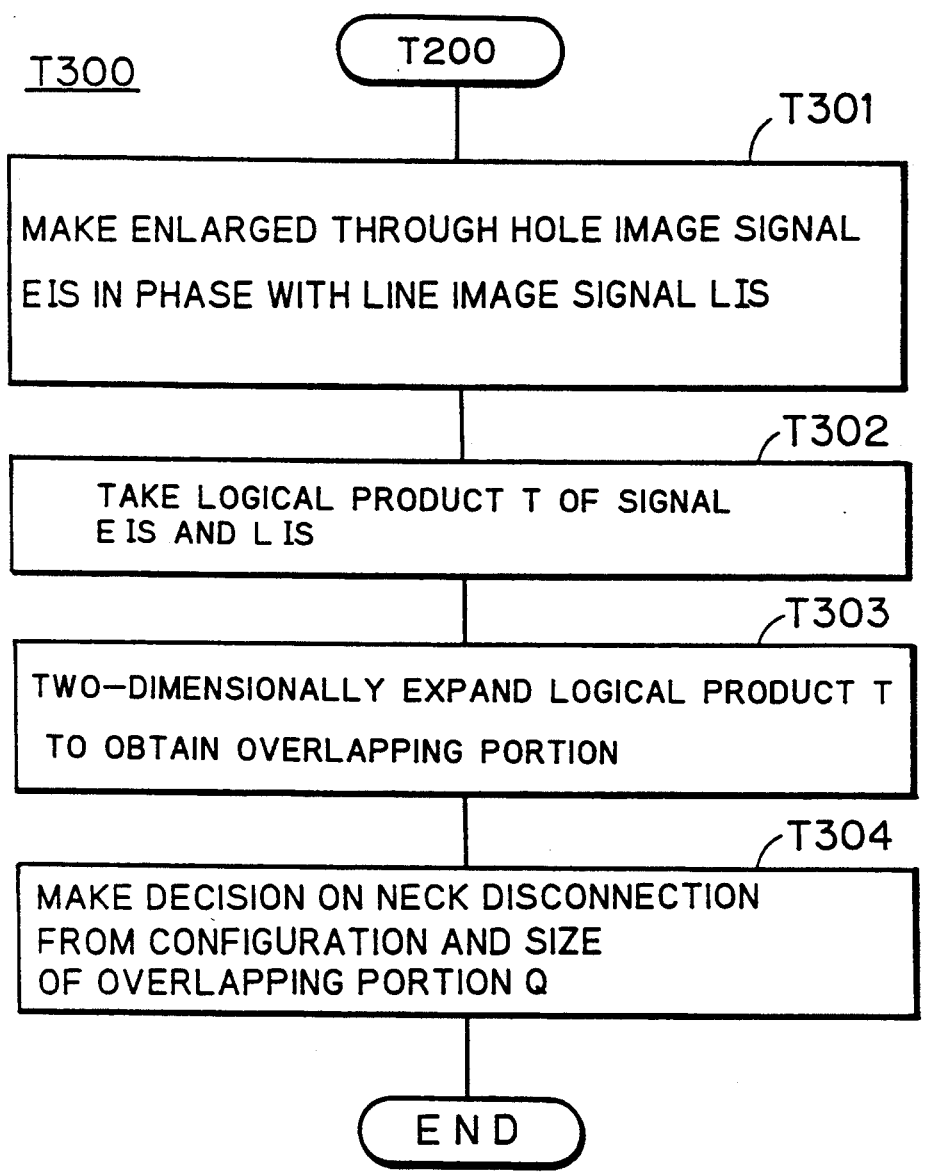
FIG. 41 is a flow chart showing a step T300 in detail.
Figure 42:
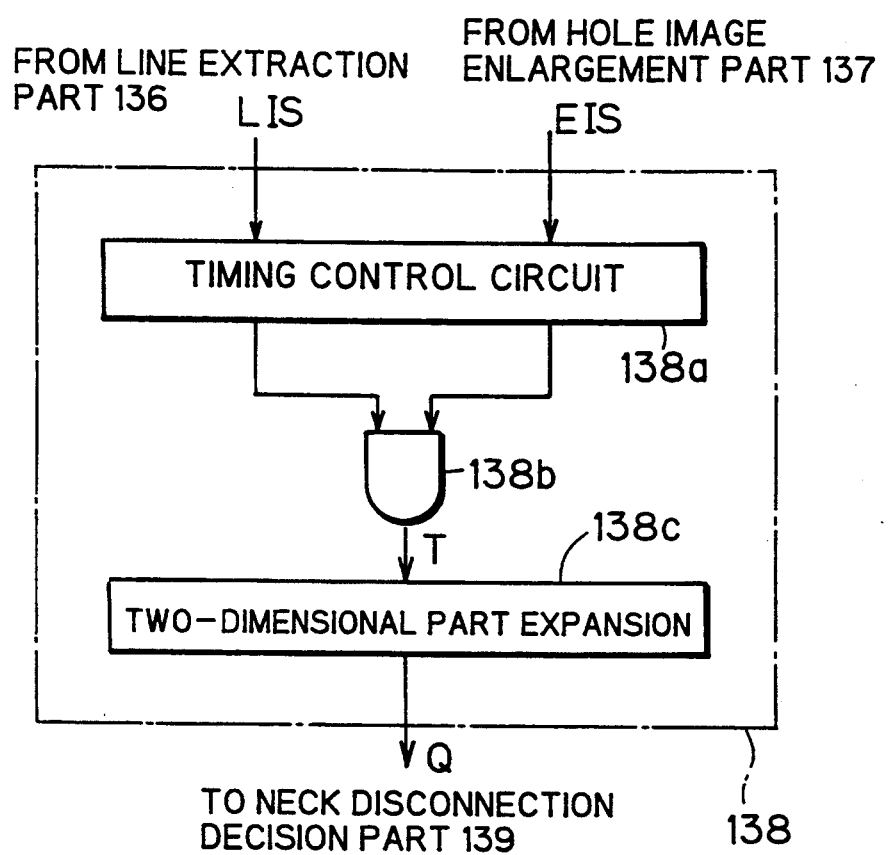
FIG. 42 is a block diagram showing the structure of a logic operation part 138.

FIGS. 41 and 42 are block diagrams showing the detail of the step T300 shown in FIG. 23 and the internal structure of the logic operation part 138, respectively.

At the step T301, the enlarged through hole image signal EIS is made in phase with the line image signal LIS. Time alignment is made for compensating times required for obtaining the respective signals, to positionally align the line image LI and the enlarged through hole image EI corresponding to these signals with each other. A timing control circuit 138a, which consists of a delay circuit and the like, delays these signals.

Then, the logical product T of these signals is taken at the step T302, and this logical product T is two-dimensionally expanded at the step T303. In more concrete terms, an AND gate 138b takes the logical product T, and a two-dimensional expansion part 138c expands the same into a two-dimensional array of data values. The two-dimensional expansion part 138c comprises a set of shift registers, similarly to the two-dimensional expansion part 136a of the line extraction part 136.

Figure 43:
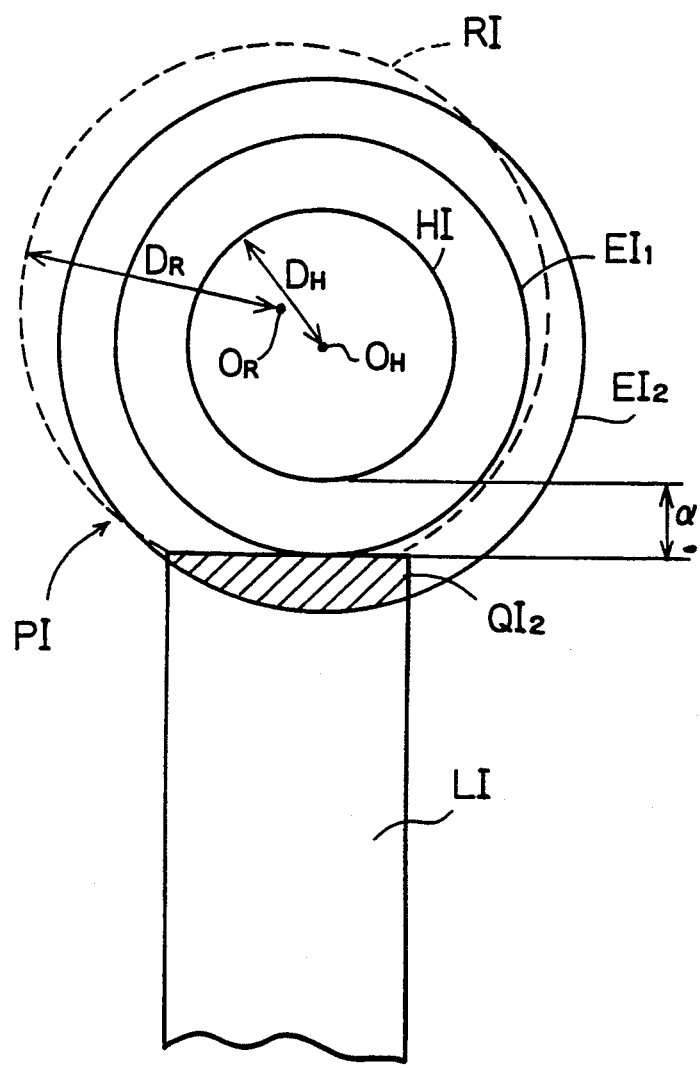
FIG. 43 is an explanatory diagram showing an image of an overlapping portion.

FIG. 43 is a conceptual diagram for illustrating an overlapping portion Q corresponding to the logical product T. Enlarged through hole images $EI_1$ and $EI_2$ are obtained by enlarging the through hole image HI, and the latter is enlarged to be larger than the former. The through hole image HI is in a position ensuring the threshold value $\alpha$ (the minimum allowable value of the off-neck width B to be ensured) for neck disconnection, and the enlarged through hole image $EI_1$ is obtained by enlarging the through hole image HI by $\alpha$, as already described. Therefore, no overlapping portion is caused in correspondence to the logical product T, and no image thereof appears in FIG. 43.

When the decision of neck disconnection is made more strict and the threshold value $\alpha$ is increased, however, the degree of enlargement is increased as described above and the enlarged through hole image $EI_2$ is obtained, whereby the overlapping portion corresponding to the logical product T has spread to some extent.

A neck disconnection decision part 139 receives the logical product T and makes a decision as to neck disconnection, to output a nondefective signal OK upon a decision of no neck disconnection while outputting to MPU 150 a defective signal NG upon a detection of a neck disconnection.

Figure 44:
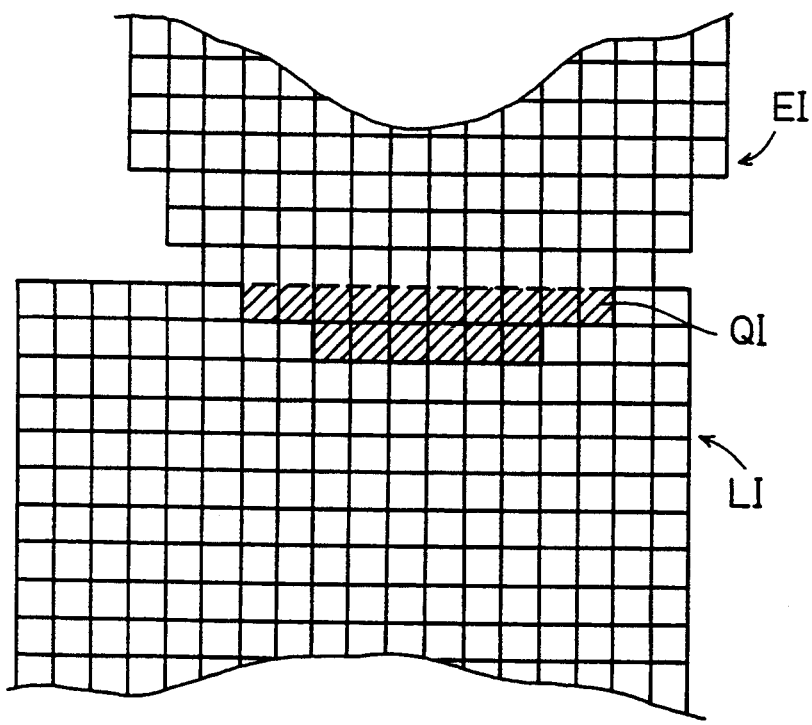
FIG. 44 is an explanatory diagram showing an image of an overlapping portion.

FIG. 44 illustrates an image QI of an overlapping portion in the units of pixels. Since the minimum value α of the off-neck width B to be ensured is taken into consideration in the enlargement of the through hole image HI, the neck disconnection decision part 139 may make a decision of neck disconnection at the step T304 for all the cases where finite overlapping portions are obtained. However, it may be necessary to consider an error in recognition of the line image LI, a quantization error and the like, and the configuration of the image QI of the overlapping portion as well as the mode of linkage of pixels may be regarded as factors in the neck disconnection decision. For example, it is possible to make a decision of neck disconnection only when there is a portion on which at least 4 pixels are linked to each other. The neck disconnection decision part 139 for making such a decision can be easily attained with a logic circuit, a neural network etc., or with software.

Figure 45:
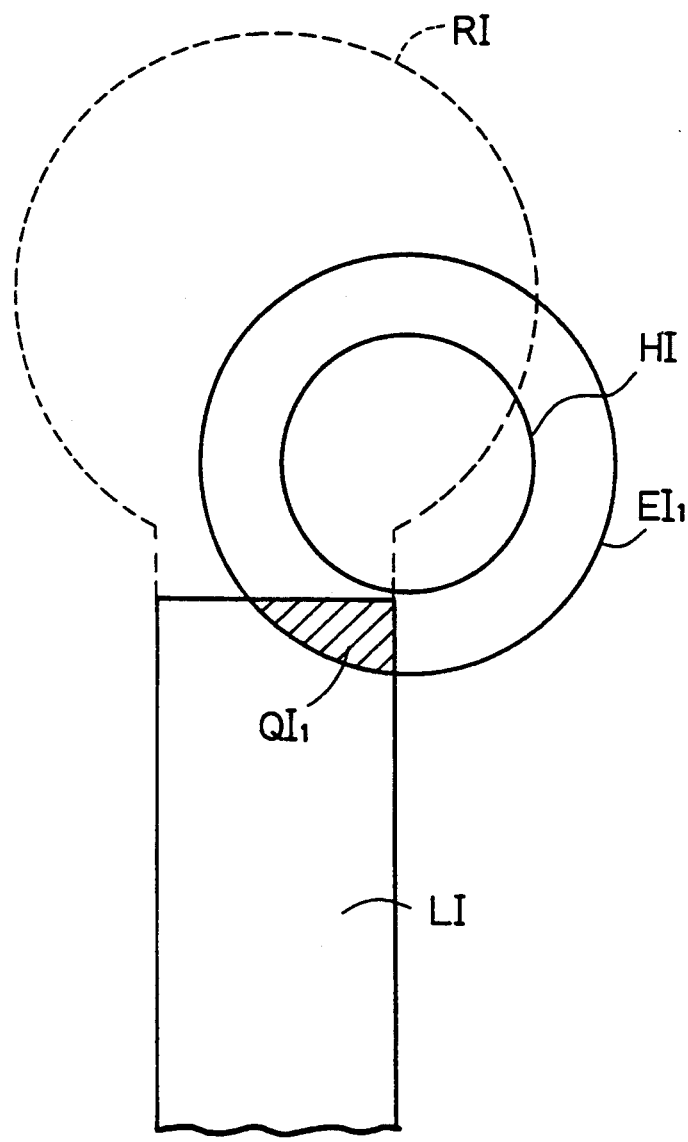
FIG. 45 is an explanatory diagram showing an image of an overlapping portion.

When the line image LI is retracted as mentioned in the previous section with reference to FIG. 49, the hole H intersects with the neck line K and a decision of neck disconnection should be made because the rest amount B is regularly zero. When enlargement by a prescribed size is made to obtain an enlarged through hole image $EI_1$ as shown in FIG. 45, the overlapping portion $QI_1$ of the logical product T necessarily has considerable spread, and hence the neck disconnection decision part 139 can make a decision of neck disconnection. Thus, the present invention is also effective in such a case.

K. Modifications

Figure 46:
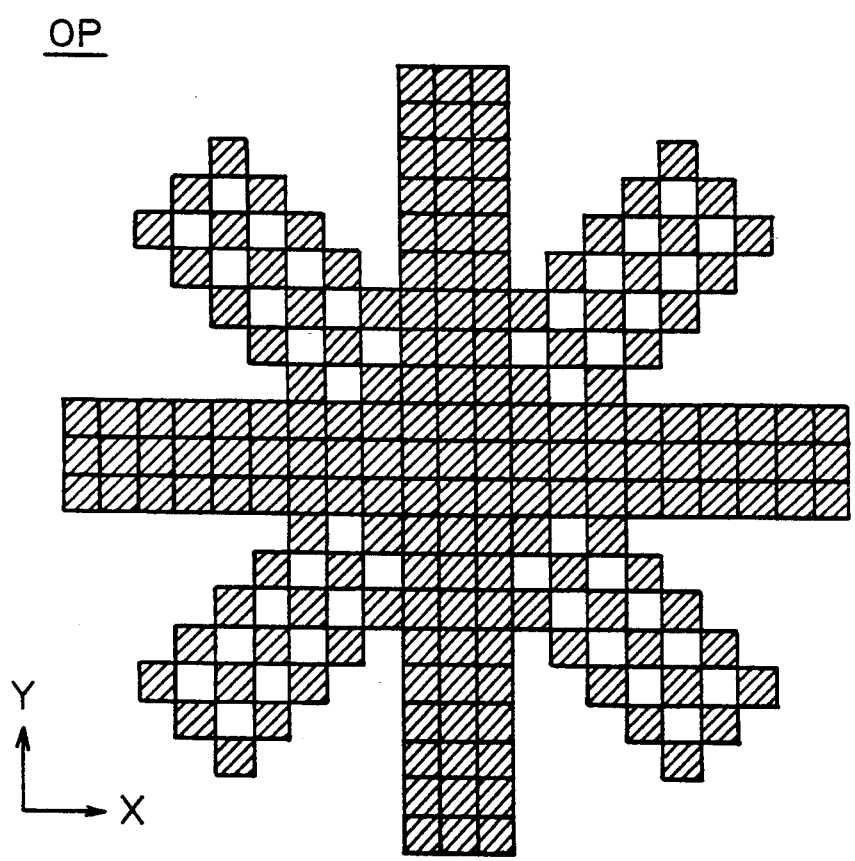
FIG. 46 is an explanatory diagram showing another preferred embodiment.

An operator OP may also comprise arms which are inclined by 45° with respect to the X and Y directions as shown in FIG. 46, so that wiring patterns running in these directions can be also recognized as lines, whereby the present invention is applicable in a wider range.

Also employable is a simple cross operator whose each arm has only a single unit-arm. In this case, an end portion of a line image LI is decided by detecting changes of values of widths $LA_x$, $LA_y$ and the like with the scan of the image. In this case, however, recognition of the line image LI may be somewhat incorrect since there is a blind zone. This problem can be solved by changing the amount of enlargement processing in the hole image enlargement part 137, or by changing the criterion of deciding neck disconnection in the neck disconnection decision part 139. In general, radial operators having arms extending from the center area of the operators may be employed.

Figure 47:
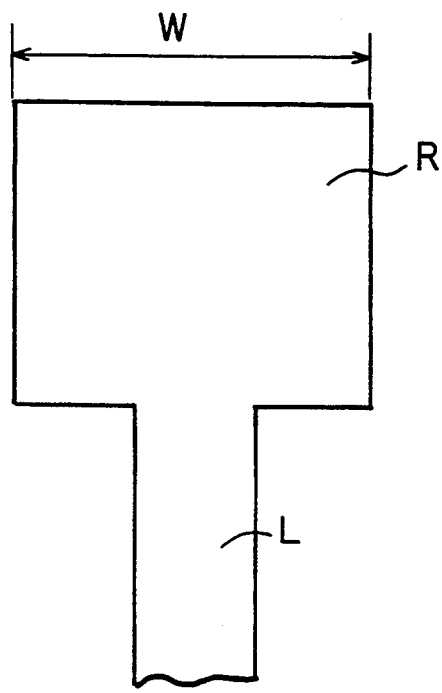
FIG. 47 is an explanatory diagram showing further another embodiment.

Further, the present invention is also applicable to a rectangular land R. In this case, a land image RI may also be recognized as a line image LI since there is no change of a width W in the land R similarly to a line L, as shown in FIG. 47. However, since the operator OP is set to be smaller than the land R as already described with reference to the expression (3), this portion is not recognized as the line image LI.

While the invention has been shown and described in detail, the foregoing description is in all aspects illustrative and not restrictive. It is understood that numerous modifications and variations can be devised without departing from the scope of the invention.

We claim:

1. A method of inspecting a printed board having a wiring pattern including a wiring line and a through hole surrounded by a land, the method comprising the steps of:
   (a) photoelectrically scanning said printed board to obtain a pattern image representing said wiring pattern and a hole image representing an image of said through hole;
   (b) converting said pattern image to a modified pattern image;
   (c) converting said hole image to a modified hole image; and
   (d) analyzing said modified pattern image and said modified hole image to detect a neck disconnection between said land and said wiring line in said wiring pattern.

2. The method of claim 1, wherein
   the step (b) comprises the step of:
   (b-1) thinning said pattern image to obtain a thinned pattern image serving as said modified pattern image;
   the step (c) comprises the step of:
   (c-1) obtaining a window encompassing said hole image, said window serving as said modified hole image; and
   the step (d) comprises the steps of:
   (d-1) counting end points of said thinned pattern image to obtain the number of said end points; and
   (d-2) determining the presence of said neck disconnection according to said number of said end points.

3. The method of claim 2, wherein
   the step (d-2) comprises the step of:
   (d-2-1) deciding that said wiring pattern has said neck disconnection when said number of end points is an odd number larger than one.

4. The method of claim 3, wherein
   the step (c-1) comprises the steps of:
   (c-1-1) obtaining a center point of said hole image; and
   (c-1-2) defining said window such that a center of said window coincides with said center point of said hole image.

5. The method of claim 4, wherein
   the step (c-1-2) comprises the steps of:
   obtaining a diameter of said hole image; and
   defining a size of said window in proportion to said diameter of said hole image.

6. The method of claim 5, wherein
   the step (c) further comprises the step of:
   (c-2) assigning a label number to said hole image; and
   the step (d) further comprises the step of:
   (d-3) indicating that said neck disconnection is caused by positional deviation of said through hole from a predetermined position on said wiring pattern when it is determined in step (d-2) that said wiring pattern has said neck disconnection.

7. The method of claim 1, wherein
   the step (b) comprises the step of:

(b-2) converting said pattern image into a line image representative of said wiring line, said line image serving as said modified pattern image;

the step (c) comprises the step of:

(c-3) enlarging said hole image to obtain an enlarged hole image serving as said modified hole image; and the step (d) comprises the step of:

(d-4) determining whether said enlarged hole image overlaps said line image, to thereby detect said neck disconnection.

8. The method of claim 7, wherein
the step (c-3) comprises the step of:

(c-3-1) expanding said hole image by a predetermined expansion width to obtain said enlarged hole image.

9. The method of claim 8, wherein
the step (c-3-1) comprises the steps of:

(c-3-1-1) obtaining a value smaller than half the difference between a first and a second diameter of said land included in said wiring pattern; wherein said first and second diameters are previously determined in design of said printed board; and (c-3-1-2) determining said expansion width in accordance with said value.

10. The method of claim 9, wherein
the step (d-4) comprises the steps of:

(d-4-2) obtaining a logical product of said enlarged hole image and said line image; and (d-4-2) comparing said logical product with a predetermined value to thereby determine whether there is said neck disconnection in said wiring pattern.

11. The method of claim 10, wherein
the step (b-2) comprises the steps of:

(b-2-1) combining said pattern image with said hole image to obtain a corrected pattern image; and (b-2-2) applying a radial operator to said corrected pattern image to extract said line image from said corrected pattern image.

12. The method of claim 11, wherein
the step (b-2-2) comprises the steps of:

(b-2-2-1) defining said radial operator such that said radial operator has a plurality of arms radially extending from a center of said radial operator, wherein each arm of said radial operator consists of a bundle of pixel trains;

(b-2-2-2) applying said operator to said pattern image to obtain data values on respective pixels of said radial operator;

(b-2-2-3) finding an arm of said radial operator on which a same data value continues, to thereby decide an elongated direction of said line image; and (b-2-2-4) comparing said data values among respective pixel chains in said bundle to find an end of said line image.

13. An apparatus for inspecting a printed board which has a wiring pattern including a wiring line and a through hole surrounded by a land, the apparatus comprising:

(a) a scanner for photoelectrically scanning said printed board to obtain a pattern image representing said wiring pattern and a hole image representing an image of said through hole;

(b) a first converter for converting said pattern image to a modified pattern image;

(c) a second converter for converting said hole image to a modified hole image; and (d) a detector for analyzing said modified pattern image and said modified hole image to detect a neck disconnection between said wiring line and said land in said wiring pattern.

14. The apparatus of claim 13, wherein
the first converter comprises:

(b-1) means for thinning said pattern image to obtain a thinned pattern image serving as said modified pattern image;

the second converter comprises:

(c-1) means for obtaining a window encompassing said hole image, said window serving as said modified pattern image; and the detector comprises:

(d-1) means for counting end points of said thinned pattern image in said window to obtain the number of said end points; and (d-2) means for detecting said neck disconnection in connection with said number of said end points.

15. The apparatus of claim 14, wherein
the means (d-2) comprises:

(d-2-1) means for determining that said wiring pattern has said neck disconnection when said number of end points is an odd number larger than one.

16. The apparatus of claim 15, wherein
the means (c-1) comprises:

(c-1-1) means for obtaining a center point of said hole image; and (c-1-2) means for defining said window such that a center of said window coincides with said center point of said hole image.

17. The apparatus of claim 16, wherein
the means (c-1-2) comprises:

means for obtaining a diameter of said hole image; and means for defining a size of said window in proportion to said diameter of said hole image.

18. The apparatus of claim 17, wherein
the second converter comprises:

(c-2) means for providing a label number to said hole image; and the detector comprises:

an indicator for indicating that said neck disconnection is caused by positional deviation of said through hole from a predetermined position on said wiring pattern when the detector detects that said wiring pattern has said neck disconnection.

19. The apparatus of claim 13, wherein the
first converter comprises:

(b-2) means for converting said pattern image into a line image representative of said wiring line, said line image serving as said modified pattern image;

the second converter comprises:

(c-3) means for enlarging said hole image to obtain an enlarged hole image serving as said modified hole image; and the detector comprises:

(d-3) means for determining whether said enlarged hole image overlaps said line image, to thereby detect said neck disconnection.

20. The apparatus of claim 19, wherein
the means (c-3) comprises:

(c-3-1) means for expanding said hole image by a predetermined expansion width to obtain said enlarged hole image.

21. The apparatus of claim 20, wherein the means (c-3-1) comprises:
   (c-3-1-1) means for providing a value smaller than half the difference between a first and a second diameter of a land included in said wiring line; wherein said first and second diameters are previously determined in design of said printed board; and
   (c-3-1-2) means for determining said expansion width in accordance with said value.

22. The apparatus of claim 21, wherein the means (d-3) comprises:
   (d-3-1) means for obtaining a logical product of said enlarged hole image and said line image; and
   (d-3-2) means for comparing said logical product with a predetermined value to thereby determine whether there is said neck disconnection in said wiring pattern.

23. The apparatus of claim 22, wherein the means (b-2) comprises:
   (b-2-1) means for combining said pattern image with said hole image to obtain a corrected pattern image; and
   (b-2-2) means for applying a radial operator to said corrected pattern image to extract said line image from said corrected pattern image.

24. The apparatus of claim 23, wherein the means (b-2-2) comprises:
   (b-2-2-1) means for holding said radial operator such that said radial operator has a plurality of arms radially extending from a center of said radial operator, wherein each arm of said radial operator consists of a bundle of pixel trains;
   (b-2-2-2) means for applying said operator to said pattern image to obtain data values on respective pixels of said radial operator;
   (b-2-2-3) means for finding an arm of said radial operator on which a same data value continues, to thereby determine an elongated direction of said line image; and
   (b-2-2-4) means for comparing said data values among respective pixel chains in said bundle to find an end of said line image.

* * * * *